(12) United States Patent
Tanaka et al.

(10) Patent No.: US 9,130,572 B2
(45) Date of Patent: Sep. 8, 2015

(54) CONTROLLER PROVIDED WITH TOUCH DETECTION DEVICE INCLUDING MOVABLE AND FIXED CONTACT PATTERNS

(75) Inventors: Hisanori Tanaka, Hamamatsu (JP); Ryohei Koga, Hamamatsu (JP); Junji Endo, Hamamatsu (JP); Tsuneo Shimizu, Hamamatsu (JP); Mitsunori Ochi, Hamamatsu (JP); Takahiro Akabane, Hamamatsu (JP)

(73) Assignee: YAMAHA CORPORATION (JP)

( * ) Notice: Subject to any disclaimer, the term of this patent is extended or adjusted under 35 U.S.C. 154(b) by 465 days.

(21) Appl. No.: 13/598,875

(22) Filed: Aug. 30, 2012

(65) Prior Publication Data

US 2013/0076542 A1    Mar. 28, 2013

(30) Foreign Application Priority Data

Aug. 30, 2011  (JP) .................... 2011-188035
Aug. 30, 2011  (JP) .................... 2011-188036
Sep. 8, 2011   (JP) .................... 2011-196233

(51) Int. Cl.
  *G08B 21/00*    (2006.01)
  *H03K 17/96*    (2006.01)
  (Continued)

(52) U.S. Cl.
  CPC ............. *H03K 17/9647* (2013.01); *G01L 1/20* (2013.01); *G01L 1/205* (2013.01); *G06F 3/02* (2013.01); *G10H 1/0558* (2013.01); *G10H 1/344* (2013.01);
  (Continued)

(58) Field of Classification Search
  CPC ........................... G06F 3/02; H03K 17/9647

USPC ............... 341/22, 23, 34; 340/407.1, 407.2; 708/146
See application file for complete search history.

(56) References Cited

U.S. PATENT DOCUMENTS 4,079,651 A   3/1978   Matsui
4,111,091 A   9/1978   Hinago
(Continued)

FOREIGN PATENT DOCUMENTS

JP    4928170       6/1972
JP    52-101432 A   1/1977
(Continued)

OTHER PUBLICATIONS

Extended European Search Report for corresponding EP 12182376.9, mail date Feb. 15, 2013.

(Continued)

*Primary Examiner* — Mark Rushing
(74) *Attorney, Agent, or Firm* — Rossi, Kimms & McDowell LLP

(57) ABSTRACT

A controller includes an operating member operable by user's depression, and a touch detection device constructed to detect a depressing touch on the operating member. The touch detection device includes a movable contact pattern provided on the lower surface of the operating member, and a fixed contact pattern disposed underneath the operating member. One of the fixed and movable contact patterns is a coil-shaped contact pattern while the other of the fixed and movable contact patterns is a uniform surface pattern, at least one of the fixed and movable contact patterns has flexibility, and at least one of the fixed and movable contact patterns has a surface slanted from the center of the coil toward the outer peripheral edge of the coil. The coil-shaped contact pattern comprises first and second contact elements constituting a dual coil pattern.

17 Claims, 12 Drawing Sheets

(51) Int. Cl.
  *G06F 3/02* (2006.01)
  *G10H 1/055* (2006.01)
  *G10H 1/34* (2006.01)
  *G10H 1/46* (2006.01)
  *G10H 3/14* (2006.01)
  *G01L 1/20* (2006.01)

(52) U.S. Cl.
  CPC .............. G10H 1/46 (2013.01); G10H 3/146 (2013.01); *G10H 2220/066* (2013.01); *G10H 2220/275* (2013.01); *G10H 2220/295* (2013.01); *G10H 2220/561* (2013.01); *G10H 2250/435* (2013.01)

(56) References Cited

U.S. PATENT DOCUMENTS

| | | |
|---|---|---|
| 4,314,227 A | 2/1982 | Eventoff |
| 4,694,231 A | 9/1987 | Alvite |
| 4,818,828 A * | 4/1989 | Curley et al. ............... 200/5 A |
| 5,948,990 A | 9/1999 | Hashida |
| 5,973,282 A | 10/1999 | Takemori et al. |
| 6,102,802 A | 8/2000 | Armstrong |
| 2002/0025842 A1* | 2/2002 | Nobe et al. ............... 463/7 |
| 2002/0104369 A1 | 8/2002 | Baker et al. |
| 2004/0104825 A1* | 6/2004 | Wang ............... 341/22 |
| 2004/0130528 A1 | 7/2004 | Baker et al. |
| 2008/0266272 A1 | 10/2008 | Narayan et al. |
| 2011/0167992 A1 | 7/2011 | Eventoff et al. |

FOREIGN PATENT DOCUMENTS

| | | |
|---|---|---|
| JP | 2-49029 A | 8/1981 |
| JP | 2-183297 A | 7/1990 |
| JP | 03055622 U | 5/1991 |
| JP | 05-087760 U | 11/1993 |
| JP | 09115384 A | 5/1997 |
| JP | 2001067980 A | 3/2001 |
| JP | 2001093368 A | 4/2001 |
| JP | 3078924 U | 5/2001 |
| JP | 2005044521 A | 2/2005 |
| WO | 01/19477 A1 | 3/2001 |

OTHER PUBLICATIONS

Office Action issued on CN201210316969.0, mailed Mar. 20, 2015. English translation provided.

Japanese Office Action issued in Japanese counterpart application No. JP2011188035, dated May 26, 2015. English translation provided.

Japanese Office Action issued in Japanese counterpart application No. JP2011188036, dated May 26, 2015. English translation provided.

* cited by examiner

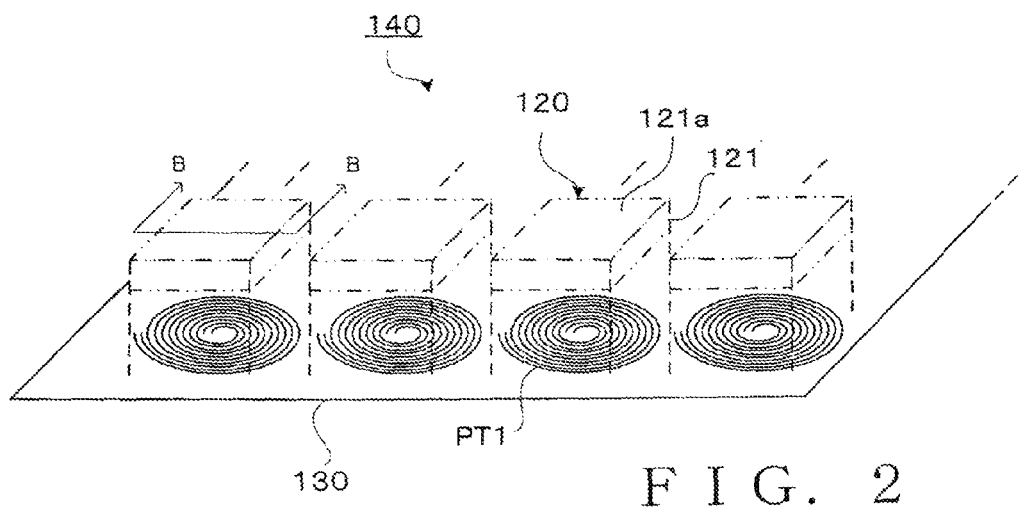
F I G. 2
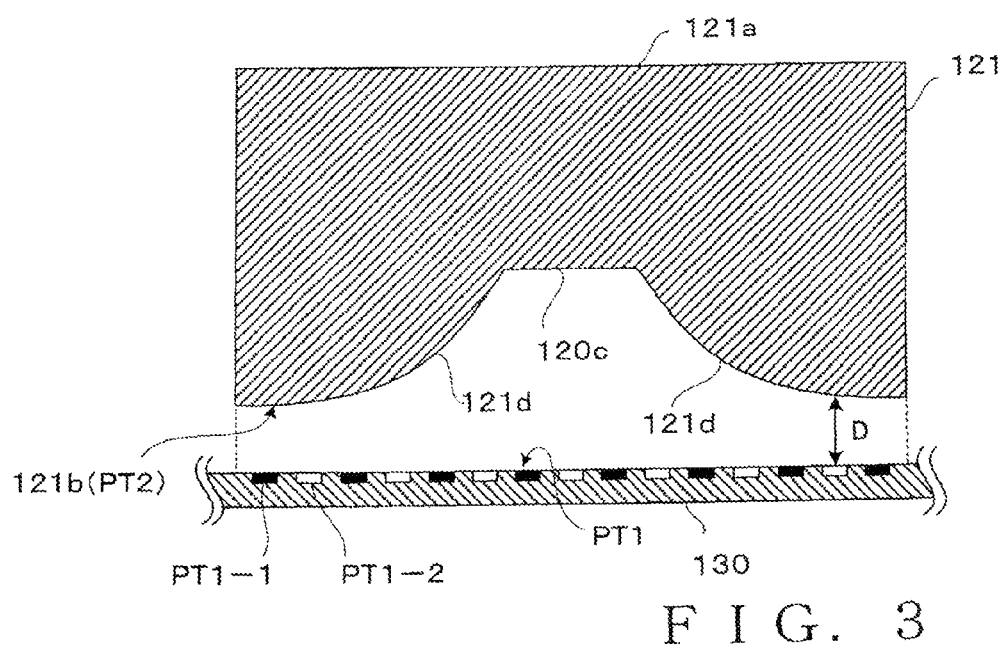
F I G. 3

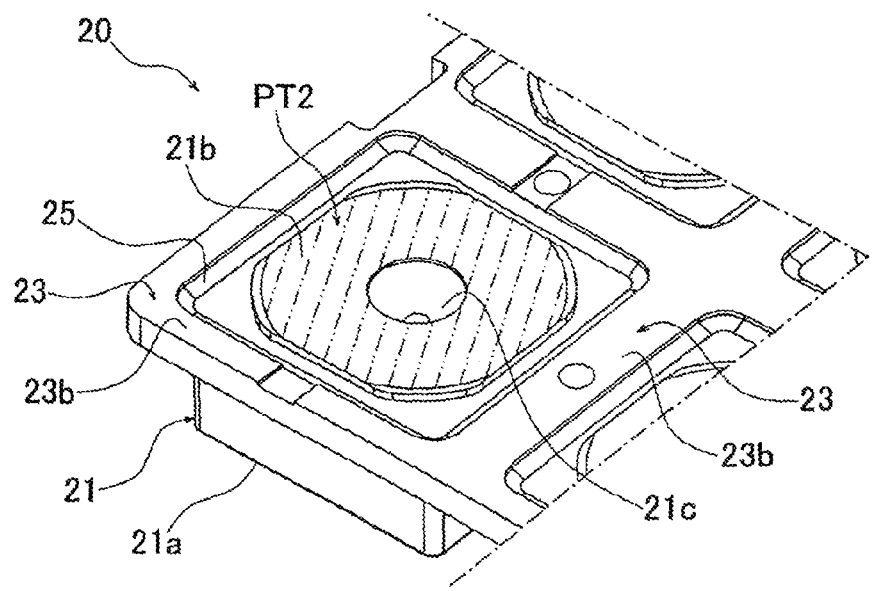
F I G. 1 3
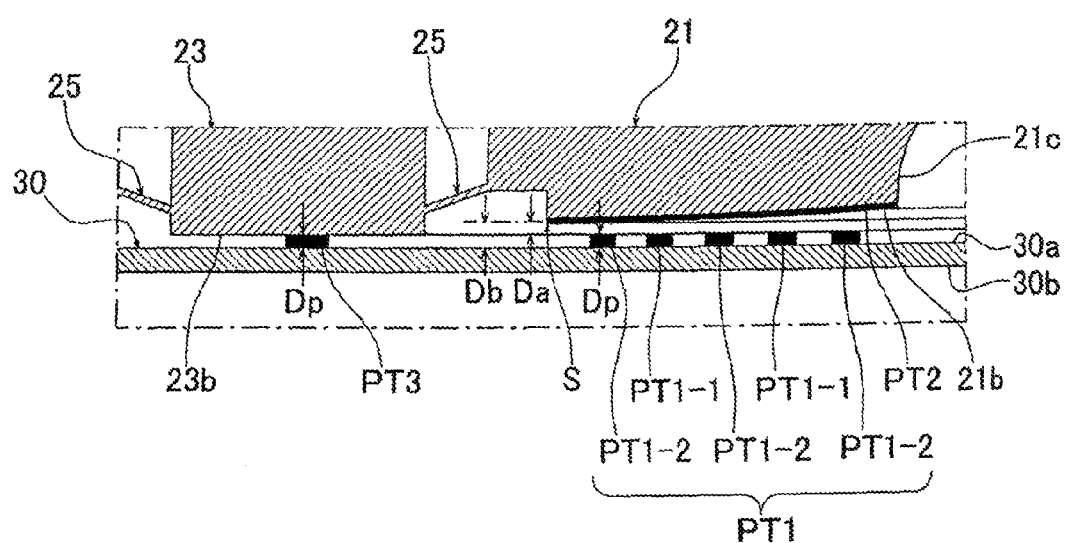
F I G. 1 4

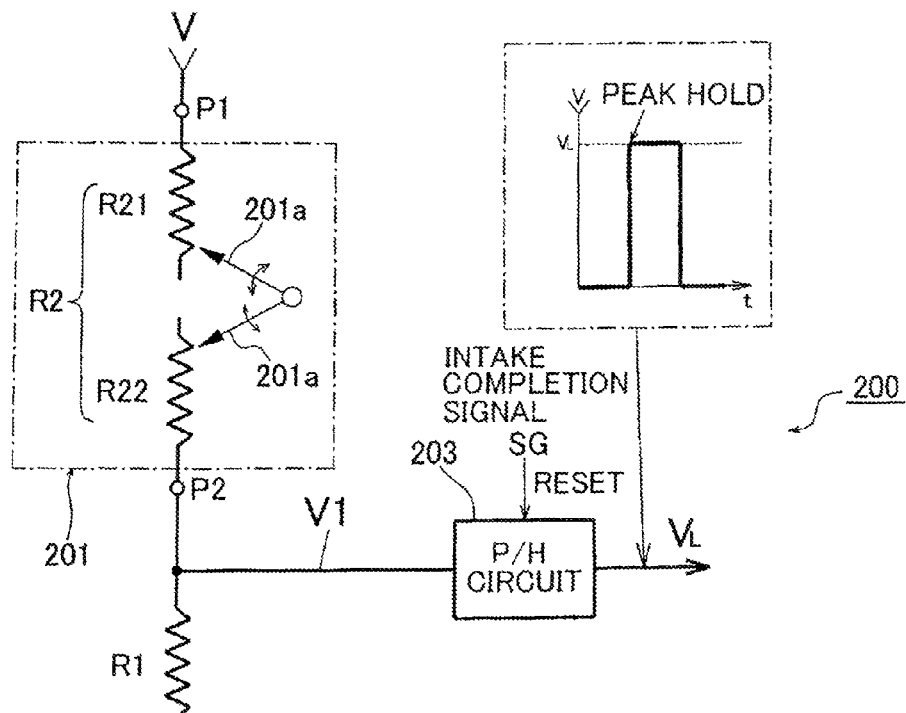
F I G. 1 5 A
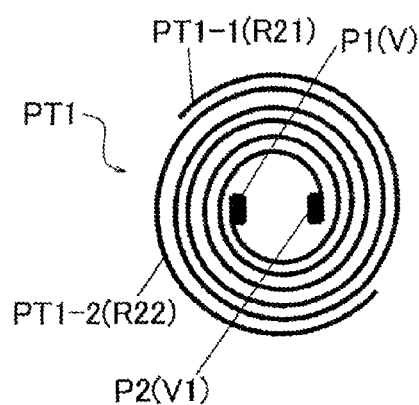
F I G. 1 5 B
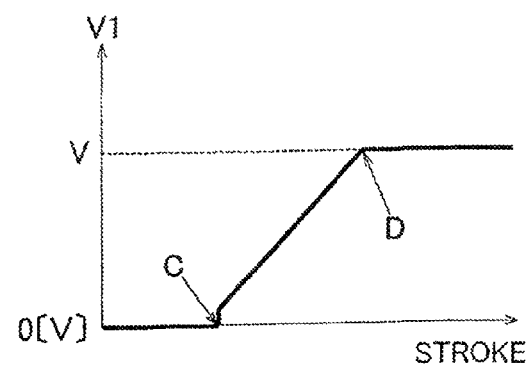
F I G. 1 5 C

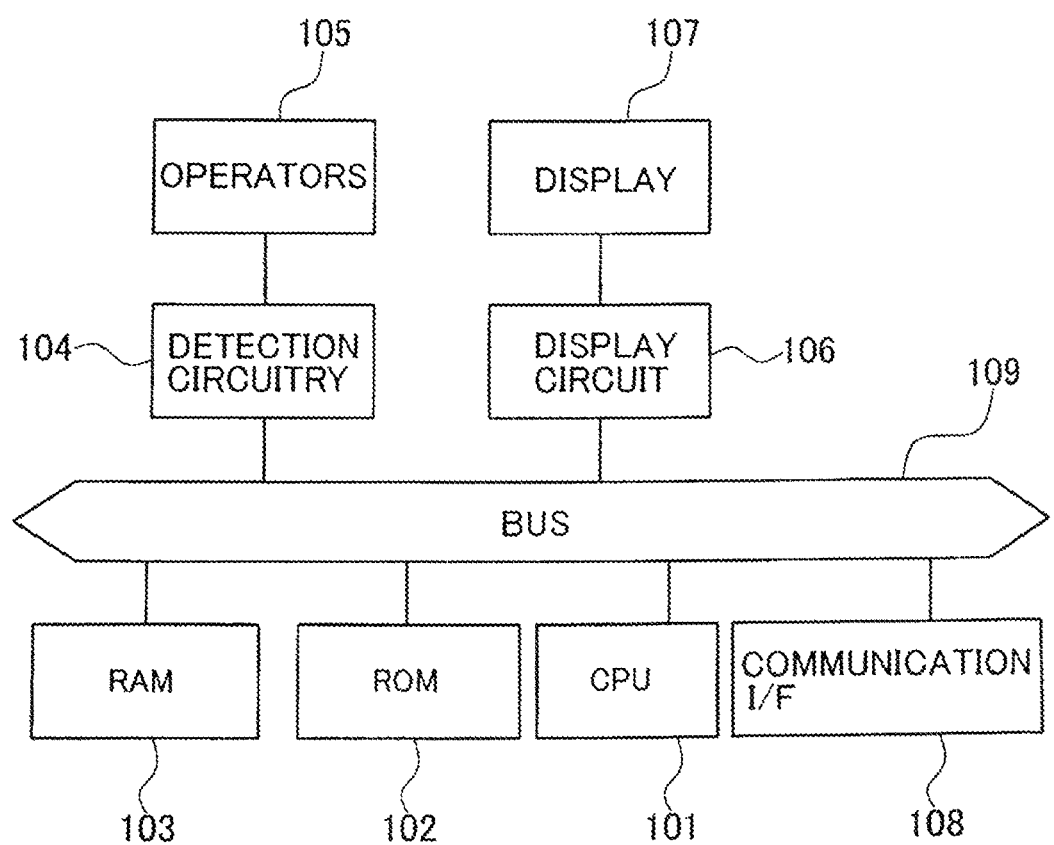
F I G. 17

CONTROLLER PROVIDED WITH TOUCH DETECTION DEVICE INCLUDING MOVABLE AND FIXED CONTACT PATTERNS

BACKGROUND

The present invention relates to a controller provided with a touch detection device for performing touch detection responsive to depressing operation on a push-button type operating member (or operator), such as a remote controller suited for music production using a computer. The present invention also relates to a touch detection device constructed to perform touch detection in response to a movable contact pattern contacting a fixed contact pattern formed on a printed circuit board.

Heretofore, it has been known to previously install, in a general-purpose computer, an application program for implementing a music production function (i.e., digital audio workstation program that will hereinafter be referred to as "DAW software") and perform music production using the installed DAW software. In the music production using such DAW software, a user inputs or enters various commands and values of various parameters, by use of a display, mouse and keyboard provided in a PC (Personal Computer) as standard equipment, so that behavior of the DAW software can be controlled. It is also conventionally known to use a physical controller, dedicated to the DAW software, to control behavior of the DAW software. There have been known various types of physical controllers (in terms of form of operation), such as one which includes, as its primary operators, fader operators and rotary knob operators and one which includes a keyboard as its primary operator (operating member). Generally, in many cases, such physical controllers include push-button type operators in addition to the aforementioned primary operators. In such cases, the push-button type operators are used exclusively as an ON/OFF switch and increment/decrement switch.

Also known is a physical controller provided with a pad type operator. The pad type operator is suited for entry operation of a rhythm part using a percussion instrument tone color because it can enter a MIDI velocity value or the like in accordance with an intensity level of user's hitting operation thereon. One example of touch detection devices for performing touch detection (pressing pressure detection) of various types of operators (operating members) including such a pad type operator is disclosed in Japanese Patent Publication No. HEI-02-49029 (hereinafter referred to as "patent literature 1"). The touch detection device disclosed in patent literature 1 includes two flexible support members opposed to and spaced from each other by a predetermined distance via a spacer member, and conductive patterns are formed on mutually-opposed surfaces of the two flexible support members. As the support members flex due to pressure (or load) acting on the surface of any of the support members, the conductive patterns contact each other so that a touch detection signal is output.

Further, as an example of a sensor capable of touch detection related to keyboard operation on an electronic keyboard instrument, a touch response sensor is disclosed in Japanese Utility Model Application Laid-open Publication No. SHO-52-101432 (hereinafter referred to as "patent literature 2"). The touch response sensor disclosed in patent literature 2 includes two generally rectangular, fixed contact sections parallel spaced from each other, and a resistant elastic or resilient member that contacts the fixed contact sections in response to key depressing operation. An area of contact between the resistant resilient member and the fixed contact sections is varied in response to a pressure increase of the key depressing operation, and resistance change responsive to variation in the area of contact between the fixed contact sections is detected.

In the touch detection device disclosed in patent literature 1, the mutually-opposed surfaces of the two flexible support members, opposed to and spaced from each other by the predetermined distance, are parallel to each other, and the conductive patterns are each formed in a straight shape on the corresponding surface. With such a construction, however, when the conductive patterns formed on the two flexible support members contact each other due to pressure (or load) acting on the surface of any of the support members, an amount of variation in the area of contact corresponding to the intensity of the pressure cannot be increased so much. Thus, a dynamic range of the touch detection signal output in response to operation of the operator is so small that the intensity of the operation of the operator cannot be detected precisely with a high accuracy.

Further, the touch response sensor disclosed in patent literature 2 is constructed in such a manner that the area of contact between the generally rectangular fixed contact sections and the resistant resilient member increases in one direction along the length of the fixed contact sections. With such a construction, a uniform detection value can be obtained in response to pressing or depressing force in the case of operation performed in one direction, such as key operation of a keyboard instrument. However, if the construction of the touch response sensor disclosed in patent literature 2 is applied to a push-button type operator, the detection value would become non-uniform due to an operated position and operated direction even in the case of depressing operation of same intensity, so that intensity of depressing operation cannot be detected accurately.

Further, with the conventionally-known physical controller of the DAW software, there has been a demand for performing parameter control using touch detection of a push-button type operator. However, the conventionally-known touch detection device would present the problem that the construction for performing the touch detection becomes relatively complicated, in addition to the aforementioned problem.

As another example of the touch detection device for keyboard operation on an electronic keyboard instrument, a sensor switch for a keyboard instrument is disclosed in Japanese Patent Application Laid-open Publication No. HEI-02-1832297 (hereinafter referred to as "patent literature 3"). The sensor switch for a keyboard instrument disclosed in patent literature 3 includes an upper substrate having flexibility and electrical insulating property, a lower substrate having an electrical insulating property and spaced from the lower surface of the upper substrate by a predetermined distance via a spacer member. Further, a conductive pattern (movable contact pattern) is formed on the lower surface of the upper substrate, and a felt cushion member is attached to the upper surface, which is a pressing surface, of the upper substrate. Further, an electrode section (i.e., electrode surface) is provided on a portion of the lower substrate's upper surface which is opposed to the above-mentioned conductive pattern. A contact section (switch contact) is constituted by the conductive pattern and the electrode section. Thus, as a pressing pounder is pressed by depression of a key of the keyboard, the upper substrate supported via the spacer is resiliently flexed downward so that the conductive pattern contacts the electrode section, and thus, the switch contact is turned on through electric conduction of the electrode section.

In the aforementioned construction, the conductive pattern is formed on the upper substrate by applying conductive paste onto the upper substrate, or by immersing the upper substrate, having its surface subjected to predetermined masking, in liquid conductive paint. In this case, the formed conductive pattern might differ, although slightly, in thickness dimension depending on various conditions, such as a temperature of the material and atmosphere at the time of the formation. Thus, the thickness dimension of the conductive pattern on the upper substrate cannot be completely the same per product of the sensor switch.

Further, with the construction disclosed in patent literature 3, the spaced-apart distance between the upper substrate having the conductive pattern formed thereon and the lower substrate having the electrode section formed thereon is determined by the thickness dimension of the spacer member. Thus, if the thickness dimension of the conductive pattern on the upper substrate differs per product as noted above, the spaced-apart distance between the conductive pattern and the electrode section would differ among products.

In such a case too, if the spaced-apart distance between the upper substrate and the lower substrate can be made great, namely, if a touch detecting stroke of a depressing member can be set greater, the thickness dimension of the conductive pattern can be made much smaller than the stroke, and thus, differences or variations in touch detection accuracy among different touch detection devices can be prevented from becoming very great.

By the way, in small-size switches or the like, the spaced-apart distance between the conductive pattern and the electrode section in a non-operating state of the switch is set very small. In this case, even if the thickness dimension of the conductive pattern differs only slightly, a great difference would occur in an output value (detection value) responsive to touch operation of same intensity. Namely, with a touch detection device having a small touch detecting stroke, it is difficult to realize a uniform touch detecting sensitivity among a multiplicity of products.

Among examples of touch detection devices like the one disclosed in patent literature 1 is one that is constructed to change luminance and displayed color of a display, disposed near the touch detection device, in accordance with intensity of user's operation to thereby allow the user to ascertain whether input touch operation of an intended intensity has been performed by the user. In this case, in order to allow the user to more intuitively identify or ascertain the intensity of the touch operation, it is desirable that a display be provided inside (within) of the touch detection device, e.g., immediately under the pad. However, with the sensor structure disclosed in patent literature 1, it is difficult to secure a space providing such a display inside the touch detection device, and thus, such a display has to be provided outside the touch detection device.

SUMMARY OF THE INVENTION

In view of the foregoing prior art problems, it is an object of the present invention to provide an improved controller which is capable of touch detection corresponding to a depressed amount of a push type operating member, and which increases a dynamic range of a touch detection signal to thereby allow an intensity of touch operation to be detected with a high accuracy.

It is another object of the present invention to provide an improved touch detection device which, with a simple construction and with simple manufacturing steps, can realize uniform touch detection sensitivity among a plurality of products that differ from one another in thickness dimension of a contact pattern formed on a printed circuit board.

In order to accomplish the above-mentioned object, the present invention provides an improved controller, which comprises: an operating member (120) operable by user's depression thereof; and a touch detection device (140) constructed to detect a depressing touch on the operating member, the touch detection device including: a movable contact pattern (PT2) provided on a lower surface of the operating member; and a fixed contact pattern (PT1) disposed underneath the operating member. One of the fixed contact pattern (PT1) and the movable contact pattern (PT2) is a coil-shaped contact pattern, and the other of the fixed contact pattern (PT1) and the movable contact pattern (PT2) is a uniform surface pattern, at least one of the fixed contact pattern (PT1) and the movable contact pattern (PT2) has flexibility, and at least one of the fixed contact pattern (PT1) and the movable contact pattern (PT2) has a surface slanted from a center of the coil toward an outer peripheral edge of the coil. Note that the same reference characters as used for various constituent elements of later-described embodiments of the present invention are indicated in parentheses here for ease of understanding.

When the operating member is operated by user's depression thereof, the fixed contact pattern (PT1) and the movable contact pattern (PT2) contact each other with at least one of the fixed contact pattern (PT1) and the movable contact pattern (PT2) flexibly deforming in accordance with an amount of depression (i.e., depressed amount) of the operating member; namely, the user's depression of the operating member causes contact between the coil-shaped contact pattern and the uniform surface pattern. Because at least one of the fixed contact pattern (PT1) and the movable contact pattern (PT2) has the surface slanted from the center of the coil toward the outer peripheral edge of the coil, the uniform surface pattern gradually contacts, in accordance with the depressed amount of the operating member, the coil-shaped contact pattern in a direction from the outer peripheral edge (or center) of the coil-shaped contact pattern, so that the coil is virtually invalidated at the contact portion between the fixed contact pattern and the movable contact pattern (i.e., the coil becomes a mere conductive surface at the contact portion); thus, the virtual coil portion, having electrical resistance, of the coil-shaped pattern decreases as the area of the contact between the surface pattern and the coil-shaped pattern increases. Because the virtual coil portion of the coil-shaped pattern increases or decreases in accordance with the depressed amount of the operating member, an electric circuit may be constructed to take out a detection output corresponding to the increase or decrease of the coil portion; for example, the electric circuit may be constructed to detect the increase or decrease of the coil portion as variable resistance or variable capacitance. Because relatively small variation in the depressed amount of the operating member is converted into relatively great variation in the area of contact between the surface pattern and the coil-shaped pattern, it is possible to increase a dynamic range of a detection value. In this way, the present invention can detect a touch of user's depressing operation on the operating member with a high accuracy.

Further, because the coil-shaped contact pattern and the uniform surface pattern contact each other and because at least one of the coil-shaped contact pattern and the uniform surface pattern has the surface slanted from the center of the coil toward the outer peripheral edge of the coil (i.e., a concave or convex surface, preferably a concave surface), the uniform surface pattern contacts the coil-shaped contact pattern in a ring shape (i.e., ring contact shape). Thus, for various depressing operation of the same intensity, the present invention can always obtain generally the same detection value, irrespective of differences in an operated position on the upper surface of the operating member and in an operated direction of the operating member. Because, the ring contact shape does not greatly vary in width due to differences in the operated position on the upper surface of the operating member and in the operated direction of the operating member. Thus, the aforementioned construction of the present invention is well suited for detection of a touch on a push-button type operating member.

In an embodiment, the controller (100) of the present invention is a remote controller for remote-controlling behavior related to a music production function to be performed by a computer.

In an embodiment, the controller of the present invention further comprises: an assignment section (2, 150, 152) constructed to assign, to one the operating member, one of a plurality of types of parameters for controlling the behavior related to the music production function to be performed by the computer; a conversion table (151) for converting a detection value, indicative of a depressing touch detected by the touch detection device, into a value of a parameter of a given parameter type; and a parameter value output section (2, 150) constructed to identify, in response to depressing operation of the operating member, a parameter type assigned to the operating member by the assignment section, convert, on the basis of the conversion table, the detection value, output by the touch detection device, into a value of the parameter of the identified parameter type and thereby output the converted value of the parameter.

In an embodiment, the fixed contact pattern is the coil-shaped pattern formed on a printed circuit board (30), the movable contact pattern (PT2) has the flexibility and the surface slanted from the center of the coil toward the outer peripheral edge of the coil, a spacing pattern (PT3) is formed on the printed circuit board (30) adjacent to the fixed contact pattern (PT1), the operating member (120) includes a base portion (23) and a pad section (21) movable relative to the base portion, and the base portion of the operating member is installed on the printed circuit board via the spacing pattern.

As one example, the spacing pattern (PT3) in the controller of the present invention is formed at a same step as the fixed contact pattern (PT1). Further, the spacing pattern (PT3) in the controller of the present invention has a same thickness as the fixed contact pattern.

Even where the thickness dimension of the fixed contact pattern differs among products of the controller due to various conditions of manufacturing steps as noted above, the aforementioned arrangements of the present invention can make the (spaced-apart) distance between the fixed contact pattern and the moveable contact pattern uniform among products. Namely, if the aforementioned spacing pattern is not provided, then the spaced-apart distance between the printed circuit board and the movable section opposed to the printed circuit board would be determined by dimensions, shapes, etc. of various parts of the operating member. Further, even where the spacing pattern is provided, if the spacing pattern is formed at a different step from the fixed contact pattern, then the spaced-apart distance between the printed circuit board and the movable section corresponds to the thickness dimension determined by the dimensions of the various parts of the operating member plus a thickness dimension of the spacing pattern. Therefore, if the thickness dimension of the fixed contact pattern differs among products of the controller due to various conditions of the manufacturing steps as noted above, there would inevitably occur differences in the spaced-apart distance between the fixed contact pattern and the movable contact pattern, making it difficult to make the touch detection sensitivity uniform among a multiplicity products of the controller.

In the touch detection device provided in the present invention, however, the base portion of the operating member is installed on the printed circuit board via the spacing pattern that is formed at the same step as the fixed contact pattern and that has the same thickness as the fixed contact pattern. Thus, the position of the base portion relative to the surface of the printed circuit board is defined by the spacing pattern having the same thickness as the fixed contact pattern. Thus, even where the thickness dimension of the fixed contact pattern differs among products, the present invention can make the spaced-apart distance between the fixed contact pattern and the movable contact pattern generally uniform among the products. As a result, the present invention can make the touch detection sensitivity of the touch detection device generally uniform among a multiplicity of products, thereby effectively increasing a product yield rate.

In an embodiment, the spacing pattern (PT3) is formed intermittently along frame lines of an imaginary polygonal shape surrounding the fixed contact pattern (PT1), the spacing pattern being formed so as to include at least two points (XP, YP) on a diagonal line (L1), passing through the center of the fixed contact pattern (PT1), of the imaginary polygonal shape. Further, in this case, the spacing pattern (PT3) extends from at least one of the two points (XP, YP) on the diagonal line (L1), along one of the frame lines toward a point (ZP) of another diagonal line (L2) of the imaginary polygonal shape.

In another embodiment, the spacing pattern (PT3) is formed to extend around the outer periphery of the fixed contact pattern (PT1) along an imaginary polygonal shape having a plurality of corner portions, and the spacing pattern has a blank portion, where no pattern is formed, at a position thereof corresponding to at least one of the corner portions.

In the present invention, the spacing pattern is formed in an intermittent or partly-omitted fashion. Thus, even where a wiring pattern that should extend from various component parts, such as the fixed contact pattern and an LED device provided inside the fixed contact pattern, to outside of the spacing pattern is formed on the printed circuit board, the wiring pattern can be disposed to pass through the omitted or blank portion of the spacing pattern so that the spacing pattern can be prevented from interfering with the wiring pattern.

Furthermore, in the present invention, the spacing pattern is formed so as to include at least two points on the diagonal line of the imaginary polygonal shape passing through the center of the fixed contact pattern and extend from one of the two points toward the point of the other diagonal line. Thus, even where the spacing pattern is formed in an intermittent or partly-omitted fashion, the spacing pattern allows the base portion of the operating member to be fixedly placed on the printed circuit board in a stable manner.

As an example, the fixed contact pattern (PT1) is the coil-shaped contact pattern formed on a printed circuit board (30), the movable contact pattern (PT2) has the flexibility and the surface slanted from the center of the coil toward the outer peripheral edge of the coil, a light emitting component part (35) is provided centrally in the coil of the coil-shaped contact pattern on the printed circuit board, and the operating member has translucency to direct light, emitted from the light emitting component part, toward an upper surface of the operating member.

Because the light emitting component part is disposed centrally in the coil-shaped fixed contact pattern and the operating member has translucency to direct emitted light from the light emitting component part toward the upper surface of the light emitting component part, a display for displaying a state responsive to touch operation (i.e., response state to touch operation) can be provided immediately under the movable section within the touch detection device. In this way, the user performing touch operation can more intuitively grasp information, such as intensity of the touch operation.

In an embodiment, the light emitting component part (35) comprises a plurality of light emitting elements (35a and 35b), and the operating member (20) is formed of synthetic resin having translucency. In this case, the light emitting component part (35) may comprise a plurality of light emitting elements (35a, 35b) of different emitted light colors.

Switching may be made among illumination states of the plurality of light emitting elements, so that the response state to touch response can be displayed more appropriately. Namely, in accordance with detected intensity of depressing or touching operation on the operating member, intensity of emitted light can be changed by changing the number of the light emitting elements to be illuminated. Further, in the case where the light emitting component part (35) comprises a plurality of light emitting elements of different emitted light colors, the color of light emitted by the light emitting component part can be changed by switching between illumination states of the light emitting elements in accordance with detected intensity of depressing or touching operation on the operating member.

In an embodiment, the operating member (21) has a recessed portion (21c) formed in the lower surface (21b) at a position opposed to the light emitting component part (35). With such an arrangement, the recessed portion formed in the lower surface of the operating member can prevent the operating member from interfering with the light emitting component part as the operated operating member descends, so that smooth movement of the operating member can be secured. Further, because the provision of the recessed portion in the operating member can increase the flexibility of the operating member, the present invention can secure a good contact state of the movable contact pattern, formed on the lower surface of the operating member, with the fixed contact pattern.

The following will describe embodiments of the present invention, but it should be appreciated that the present invention is not limited to the described embodiments and various modifications of the invention are possible without departing from the basic principles. The scope of the present invention is therefore to be determined solely by the appended claims.

BRIEF DESCRIPTION OF THE DRAWINGS

Certain preferred embodiments of the present invention will hereinafter be described in detail, by way of example only, with reference to the accompanying drawings, in which:

FIG. 2 is a perspective view taken generally in a direction of arrow A in FIG. 1 and explanatory of a construction of the touch detection device;

FIG. 3 is a sectional side view of one of button sections of the touch detection device taken along the B-B line of FIG. 2;

FIG. 13 is a bottom perspective view of a movable section of the operating member of FIG. 12A taken from the lower surface thereof;

FIG. 14 is a fragmentary enlarged sectional side view showing the lower surfaces of the movable section and a base portion and the upper surface of the printed circuit board shown in FIG. 12A;

FIG. 15A is a circuit diagram showing an example construction of touch detection circuitry for detecting touch operation on any one of the touch detection sections, FIG. 15B is a diagram showing correspondence relationship between the fixed contact pattern and various points and resistances in FIG. 15A, and FIG. 15C is a graph schematically showing variation in output voltage responsive to variation in a stroke amount (descending amount) of a pad section;

FIG. 17 is a block diagram showing a construction of control circuitry provided in a music piece data input device.

DETAILED DESCRIPTION OF THE INVENTION

Figure 1:
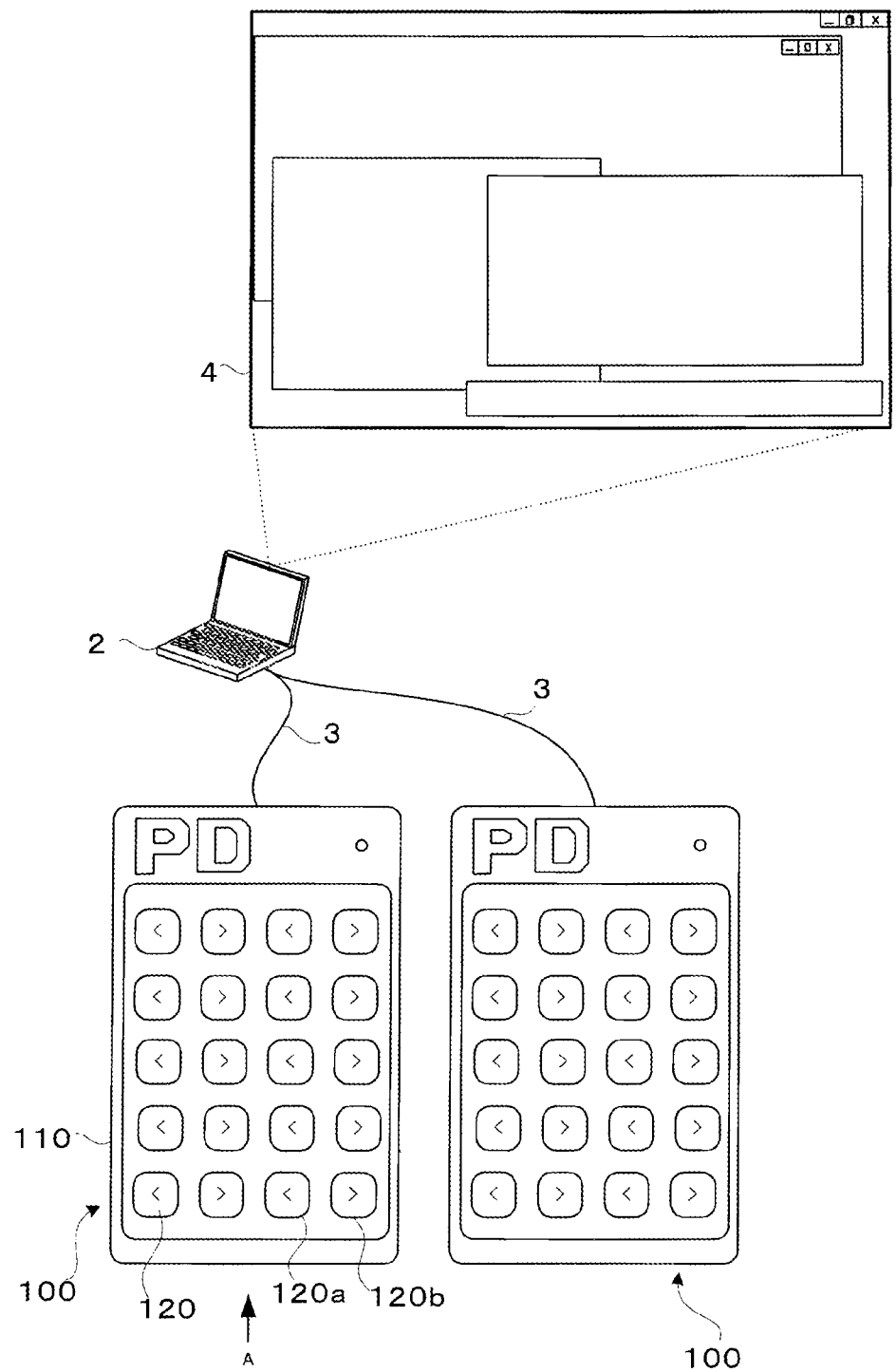
FIG. 1 is a diagram explanatory of a music production environment employing an embodiment of a controller of the present invention provided with a first embodiment of a touch detection device.

FIG. 1 is a diagram explanatory of a music production environment employing a controller 100 of the present invention provided with a first embodiment of a touch detection device 140, where the controller 100 is shown in a top plan view. As an example, the controller 100 is a remote controller for remote-controlling behavior related to a music production function performed by a computer, and the controller 100 will hereinafter be referred to also as "remote controller 100". In FIG. 1, the remote controller 100 is communicatably connected with a personal computer (PC) 2 via a communication cable 3. An interface for interconnecting the controller 100 and the PC 2 may be a conventional interface, for example, of the USB (Universal Serial Bus) standard, and the interconnection may be of either a wired type or a wireless type.

The PC 2, which is a general-purpose personal computer having a general-purpose OS (Operating System) installed therein, has installed thereon, as one of application programs, a digital audio work station program (DAW software) that causes the PC 2 to perform a music production function. The DAW software has, as its main functions, a function of recording audio waveforms and MIDI performance data on a track-by-track basis, an audio mixing function and an effecter function for performing various effect processes.

The PC 2 displays, on a display, operation screens 4 corresponding to the individual functions of the DAW software. In FIG. 1, an example of the operation screen 4 is shown in an enlarged scale. The PC 2 not only displays values of various parameters for controlling the behavior of the music production function on the operation screen 4, displayed on the display, by means of GUI (Graphical User Interface) component parts, such as button images and fader operator images, but also receives user's operation for adjusting such parameter values.

The remote controller 100 is used for remote-controlling the behavior of the music production function of the DAW software running on the PC 2. The remote controller 100 includes a plurality of (twenty in the illustrated example) push-button type operating members (or operators) 120 provided on the upper surface of an exterior casing 110. The user can remote-control the behavior of the music production function of the DAW software by depressing any one of the push-button type operating members 120 to thereby adjust a value of a desired parameter currently displayed on the operation screen 4. The instant embodiment can be practiced as long as one remote controller 100 is connected to a single PC 2. A plurality of (two in the illustrated example of FIG. 1) controllers 100 may be connected to the single PC 2 so that the DAW software running on the single PC 2 can be remote-controlled via the plurality controllers 100, as shown in FIG. 1.

As shown in FIG. 1, the twenty push-button type operating members 120 are disposed on the upper surface of the external casing 110 in a matrix configuration with five push-button type operating members 120 in each vertical row (column) and four push-button type operating members 120 in each horizontal row. The external casing 110 is a generally rectangular, flat plate-shaped casing member formed, for example, of synthetic resin, and the later-described touch detection device 140 is accommodated within the external casing 110. The external casing 110 is designed in a small size, for example, in considerable of portability and operability.

FIG. 2 is a perspective view, generally taken in a direction of arrow A of FIG. 1, explanatory of a construction of the touch detection device 140 accommodated within the external casing 110 of the remote controller 100. FIG. 2 particularly shows a part of a printed circuit board 130 and shows the push-button type operating members 120 in phantom line. The plurality of push-button type operating members 120 are disposed over the printed circuit board 130. The controller 100 includes the plurality of push-button type operating members 120 operable by the user pushing or depressing the same, and the touch detection device 140 constructed to detect, for each of the push-button type operating members 120, a user's pushing touch on the operating member 120. As will be later described, the touch detection device 140 further includes a plurality of fixed contact patterns PT1 formed on the printed circuit board 130 in corresponding relation to the push-button type operating members 120, and a flexible movable contact pattern PT2 (see FIG. 3) provided on the lower surface 120b of each of the push-button type operating members 120.

The printed circuit board 130 is a generally rectangular, flat plate-shaped hard board accommodatable within the external casing 110, on the upper surface of which are formed a plurality of (twenty in the illustrated example of FIG. 2) the fixed contact patterns PT1 corresponding to individual ones of the plurality of push-button type operating members 120. The twenty fixed contact patterns PT1 are disposed on the upper surface of the printed circuit board 130 in a matrix configuration, corresponding to the arrangement of the push-button type operating members 120 (see FIG. 1), with five fixed contact patterns PT1 in each vertical row and four fixed contact patterns PT1 in each horizontal row.

Each of the push-button type operating members 120 includes a push-button section (in other words, pad section or movable section) 121 disposed immediately over a corresponding one of the fixed contact patterns PT1. Each of the push-button sections 121 is formed, for example, of a flexible synthetic resin material, such as synthetic rubber or silicon resin, and has its upper surface functioning as an operating surface (key top) 121a operable with a user's finger or the like. Each of the button section 121 is mounted in such a manner that it is generally vertically movable relative to the printed circuit board 130 within a predetermined stroke range in response to user's depressing operation thereon. A position of the button section 121 to the printed circuit board 130 varies in accordance with intensity (depressing pressure or depth) of the push-button type operating member 120. A mounting structure of the button sections 121 may be constructed in any desired manner as along as each of the button sections 121 is movable within a predetermined stroke range in response to depressing operation by the user.

FIG. 3 is a sectional view of one of the button sections 121 taken along the B-B line of FIG. 2. The button section 121 has a recessed portion 121c of a generally truncated cone shape formed in the lower surface 121b of the button section 121. The lower surface 121b, as a whole, is formed in a concave shape slanted surface 120d such that a height (gap) D relative to the fixed contact pattern PT1 on the printed circuit board 130 gradually increases in a direction from the outer peripheral edge of the lower surface 121b toward the center of the lower surface 121b. Such a lower surface 121b of the button section 121 as a whole forms the movable contact pattern PT2. As an example, it is desirable that the slanted surface 120d curve gently in such a manner as to slightly protrude toward the center of the button section 121. Namely, the operating member 120 is disposed in such a manner that the gap (D) exists between the movable contact pattern PT2 and the fixed contact pattern PT1 when the operating member 120 is not being operated (i.e., when the operating member 120 is in a non-operating state). Because of the slanted surface of the PT2, the gap (D) changes in size along the slanted surface 120d of the movable contact pattern PT2 in response to operation of the operating member 120.

The movable contact pattern PT2 is a conductive, uniform surface pattern, which, for example, may be formed by applying conductive paint or formed of conductive rubber integrally with the button section 121. The movable contact pattern PT2 may be formed in such a manner that, as viewed in bottom plan, the lower surface 121b of the button section 121 has a similar shape to that of the corresponding fixed contact pattern PT1 and has generally the same diameter as the corresponding fixed contact pattern PT1. Because the lower surface 121b of the button section 121 is formed in the slanted, concave shape as noted above, the spaced-apart distance between the movable contact pattern PT2 and the fixed contact pattern PT1 (i.e., height D of the movable contact pattern PT2) is not uniform along the diametric direction of the lower surface 121b of the button section 121, but gradually increases in a direction from an outer diameter side to an inner diameter side of the lower surface 121b.

Figure 4:
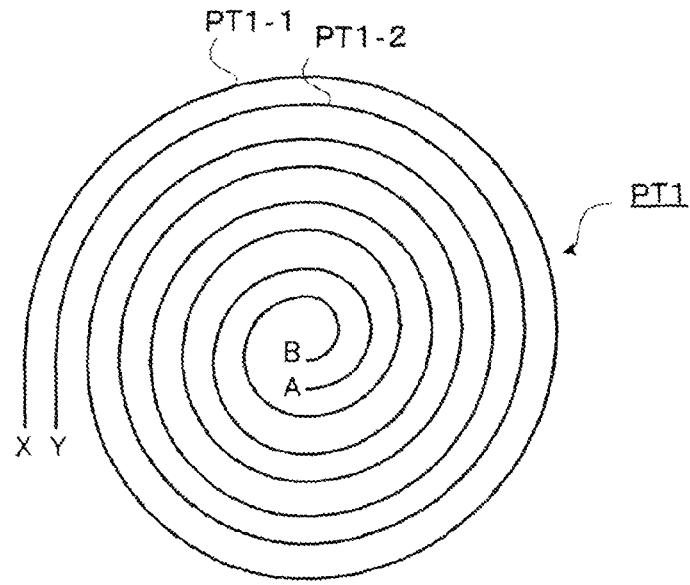
FIG. 4 is a plan view showing one of fixed contact patterns taken from above the upper surface of a printed circuit board in the first embodiment.

FIG. 4 is a plan view of one of the fixed contact patterns PT1 taken from above the upper surface of the printed circuit board 130. The fixed contact pattern PT1 comprises two contact patterns (i.e., first contact pattern element PT1-1) and second contact pattern element PT1-2) arranged generally in parallel to each other and each having a spiral or coil shaped extending from its central portion toward its diametrically outer portion. Namely, the fixed contact pattern PT1 comprises the first contact pattern element PT1-1 and second contact pattern element PT1-2 that together constitute a dual coil-shaped pattern. Although not particularly shown, a lead wire for connecting the fixed contact pattern PT1 to an electric circuit (not shown) is disposed around the fixed contact pattern PT1.

As shown in FIG. 4, the first contact pattern element PT1-1 and the second contact pattern element PT1-2 comprise coil-shaped contact patterns extending in a same direction generally parallel to each other from respective inner end portions A and B, located in the central region of the fixed contact pattern PT1, to respective outer ends X and Y located in the diametrically outer region of the fixed contact pattern PT1. Thus, the first contact pattern element PT1-1 and the second contact pattern element PT1-2 are arranged alternately with predetermined intervals along the diametric direction of the fixed contact pattern PT1. In the sectional view of FIG. 3, the first contact pattern element PT1-1 is indicated in black while the second contact pattern element PT1-2 is indicated in white, from which it is apparent that the first contact pattern element PT1-1 and the second contact pattern element PT1-2 are arranged alternately along the diametric direction of the fixed contact pattern PT1 (left-right direction in FIG. 3). Note that, whereas the first contact pattern element PT1-1 and the second contact pattern element PT1-2 are indicated in FIG. 4 by lines for convenience of illustration and description, they may comprise bar-shaped patterns each having a given width. In FIG. 4, for example, the first contact pattern element PT1-1 and the second contact pattern element PT1-2 are in the form of dual coils such that their respective coil start positions (end portions X and Y) are located at a generally identical position and their respective coil end positions (end portions A and B) are located at a generally identical position as shown in FIG. 4.

The first contact pattern element PT1-1 and the second contact pattern element PT1-2, together constituting the fixed contact pattern PT1, are each formed of a predetermined electric resistant substance or material; for example, the first and second contact pattern elements PT1-1 and PT1-2 may each be in the form of a resistant carbon pattern or low resistant conductive pattern, and such a fixed contact pattern PT1 can be formed through simple processing, such as printing. More specifically, such a fixed contact pattern PT1 can be formed by applying conductive-paste paint onto the upper surface of the printed circuit board 130, or immersing, after having masked the other portion of the upper surface of the printed circuit board 130 than a portion where the fixed contact patterns PT1 is to be formed, the printed circuit board 130 in liquid conductive paint to thereby attach the conductive paint to the upper surface of the printed circuit board 130. An insulating member is provided on the portion where the fixed contact pattern PT1 is not formed, i.e. the portion between the first contact pattern element PT1-1 and the second contact pattern element PT1-2, to thereby electrically insulate between the first contact pattern element PT1-1 and the second contact pattern element PT1-2. As will be detailed later, the first contact pattern element PT1-1 and the second contact pattern element PT1-2 are electrically interconnected in response to the movable contact pattern PT2 contacting the fixed contact pattern PT1, so that the coils are virtually invalidated at the contact portion between the fixed contact pattern PT1 and the movable contact pattern PT2 (i.e., become a mere conductive surface at the contact portion); thus, the virtual coil portions having electrical resistance decreases as the area of the contact between the fixed contact pattern PT1 and the movable contact pattern PT2 increases. Consequently, electrical resistance corresponding to the area of the contact, i.e. the remaining coil portions, is produced in the fixed contact side.

Figure 5A:
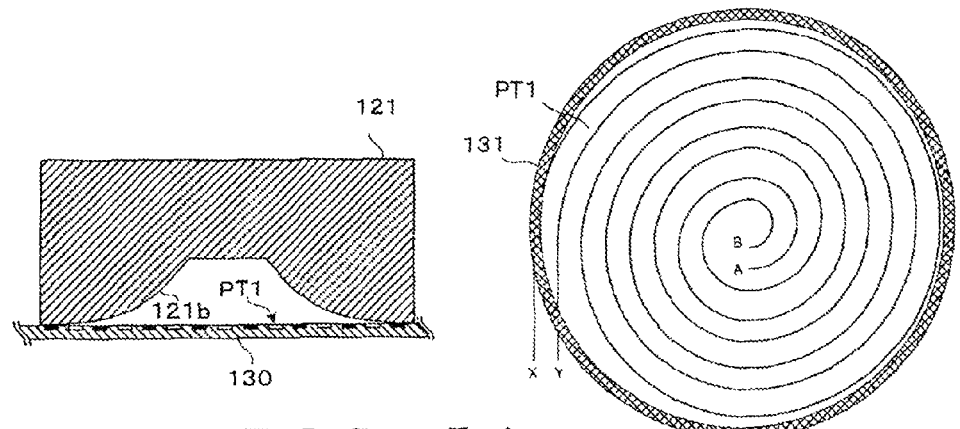
FIGS. 5A to 5C are views explanatory of variation in area of contact between a movable contact pattern and the fixed contact pattern in the first embodiment.
Figure 5B:
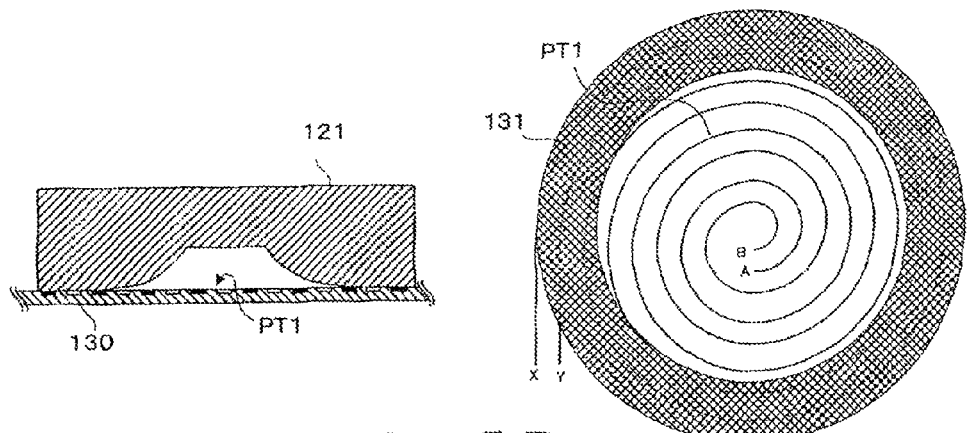
Figure 5C:
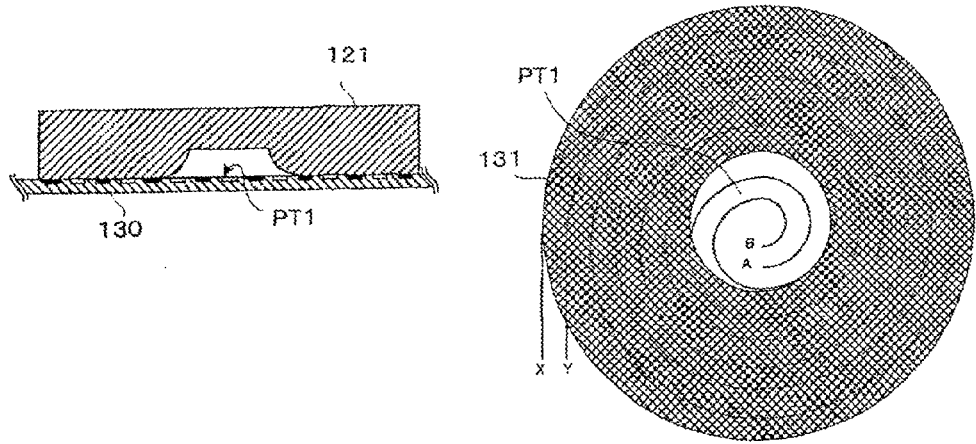

FIGS. 5A to 5C are explanatory of variation in the area of the contact of the movable contact pattern PT2 with the fixed contact pattern PT1 responsive to intensity of depressing operation on the push-button type operating member 120 (i.e., depressed amount of the push-button type operating member 120). A sectional view of the button section 121 of the operating member 120 is shown on a right side section of each of FIGS. 5A to 5C, and a plan view of the fixed contact pattern PT1 corresponding to FIG. 4 is shown on a left side section of each of FIGS. 5A to 5C.

Figure 11:
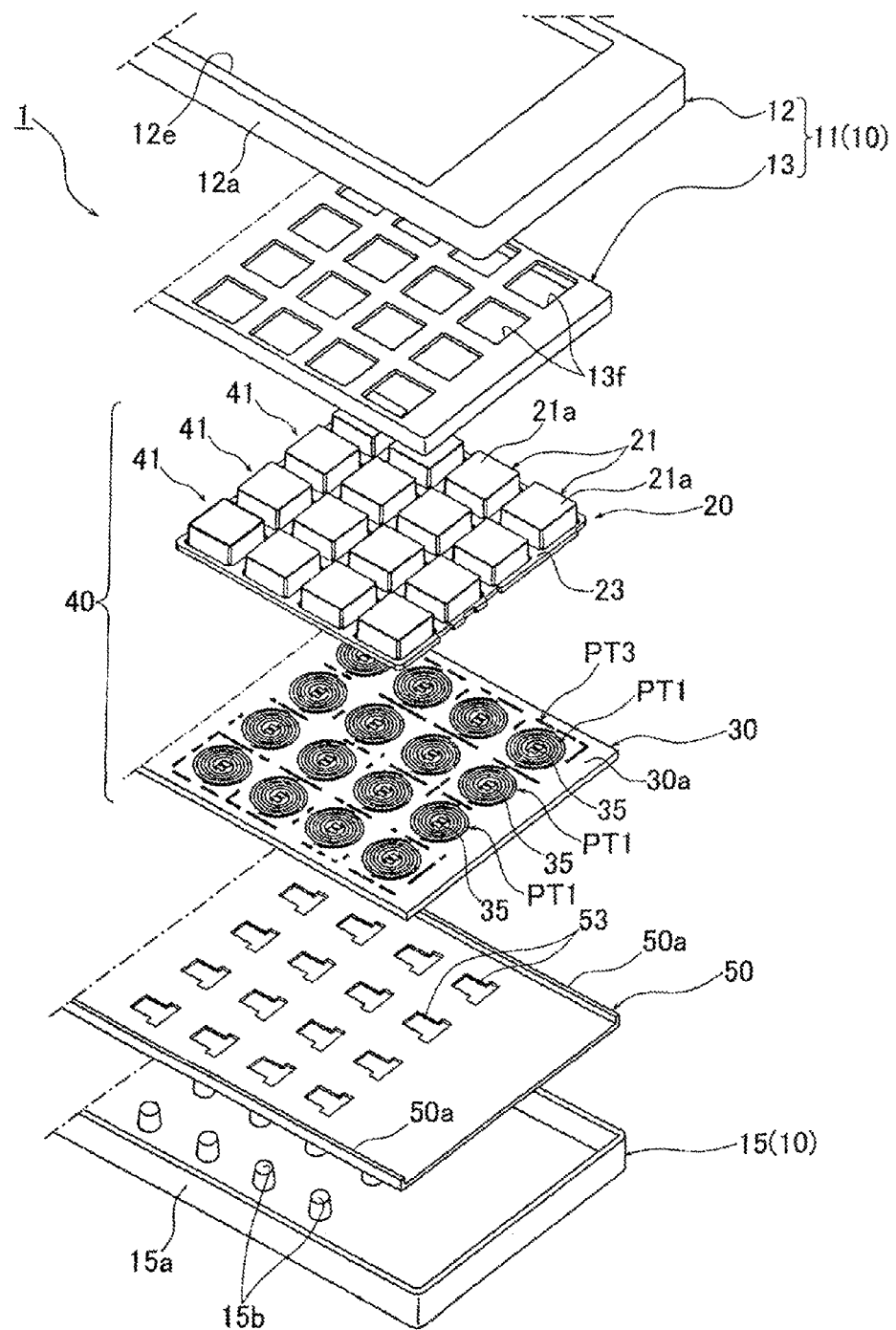
FIG. 11 is an exploded perspective view showing component parts of the controller shown in FIG. 10.

When the push-button type operating member 120 is in a non-depressed state, the button section 121 of the push-button type operating member 120 is in its non-operating (initial) position, so that the movable contact pattern PT2 provided on the lower surface 121b of the button section 121 and the fixed contact pattern PT1 provided on the upper surface of the printed circuit board 130 are opposed spaced from each other by the predetermined spaced-apart distance D (see FIG. 11).

In response to user's depressing operation on the push-button type operating member 120, the button section 121 moves downward relative to the printed circuit board 130, so that the movable contact pattern PT2 provided on the lower surface 121b of the button section 121 comes into contact with the fixed contact pattern PT1. Note that the "depressed amount" of the button section 121 represents an amount of relative positional change (descent) from the initial or non-operating position. When the depressed amount of the button section 121 is small, contact between the movable contact pattern PT2 and the fixed contact pattern PT1 starts in a manner as shown in FIG. 5A. In this state, only an outer peripheral edge region of the lower surface 121b of the movable contact pattern PT2 contacts the fixed contact pattern PT1. Thus, a surface 131 of the movable contact pattern PT2 contacting the fixed contact pattern PT1 (i.e., contact surface 131 of the movable contact pattern PT2 indicated as a shaded area) has a thin (generally line-like) ring shape and contacts only an outer peripheral region of the fixed contact pattern PT1, and the first contact pattern element PT1-1 and the second contact pattern element PT1-2 have a long length from the end portions A and B to the contact surface 131. Because the movable contact pattern PT2 is a contact pattern having electrical conductive property as noted previously, the first contact pattern element PT1-1 and the second contact pattern element PT1-2 of the fixed contact pattern PT1 are electrically connected with each other via the contact surface 131.

As an example, the end portions A and B in the central region of the coils of the first contact pattern element PT1-1 and the second contact pattern element PT1-2 are output ends, while the end portions X and Y in the diametrically outer region are open ends. Thus, in the combination of the fixed contact pattern PT1 and movable contact pattern PT2, an electric variable resistance element is provided between the end portions A and B in the central region of the coils of the first contact pattern element PT1-1 and the second contact pattern element PT1-2. For example, when the contact surface 131 is small as shown in FIG. 5A, the variable resistance element constituted by the combination of the fixed contact pattern PT1 and movable contact pattern PT2 presents an extremely great value.

Because the spaced-apart distance D between the fixed contact pattern PT1 and the movable contact pattern PT2 provided on the lower surface 121b of the button section 121 gradually increases in the direction from the outer diameter side to the inner diameter side as noted previously, the movable contact pattern PT2 sequentially contacts the fixed contact pattern PT1 from its outer side toward its inner side, in accordance with increase of the depressed amount of the button section 121. Further, because the button section 121 is formed of a resilient material, the movable contact pattern PT2, having contacted the fixed contact pattern PT1 on the upper surface portion of the printed circuit board 130, flattens out so that the contact surface 131 expands. For example, FIG. 5B shows a state where the button section 121 has been depressed to a substantial mid position in the stroke range, in which the ring-shaped contact surface 131 has expanded diametrically inward (i.e., from the outer diameter side toward the inner diameter side) in such a manner as to reduce the inner diameter as compared to that in the state of FIG. 5A. Further, FIG. 5C shows a state where the button section 121 has been depressed to the lower-limit position in the stroke range, in which the contact area 131 of the movable contact pattern PT2 has expanded over a substantially entire area of the fixed contact pattern PT1.

As shown in FIGS. 5A to 5C, the contact surface 131 of the movable contact pattern PT2 with the fixed contact pattern PT1 gradually increases in area from the outer side toward the inner side in accordance with increase of the depressed amount of the button section 121, so that the area of the contact of the movable contact pattern PT2 with the fixed contact pattern PT1 gradually increases in accordance with the increase of the depressed amount of the button section 121. Thus, in the first contact pattern element PT1-1 and the second contact pattern element PT1-2, the lengths from the end portions A and B to the contact surface 131 gradually decreases in accordance with the increase of the depressed amount of the button section 121. As the contact surface 131 gradually increases in accordance with the increase in the depressed amount of the button section 121 as noted above, the resistance value of the variable resistance element, constituted by the combination of the fixed contact pattern PT1 and movable contact pattern PT2, gradually decreases. Namely, in accordance with the intensity of depressing operation on (or depressed amount of) the button section 121, the size of the area over which the movable contact pattern PT2 contacts the fixed contact pattern PT1 varies, in response to which the resistance value of the fixed contact pattern PT1 varies. Stated differently, the fixed contact pattern PT1, as a whole, functions as a variable resistance whose resistance value varies in response to variation in the area of the contact surface of the movable contact pattern PT2.

Figure 6:
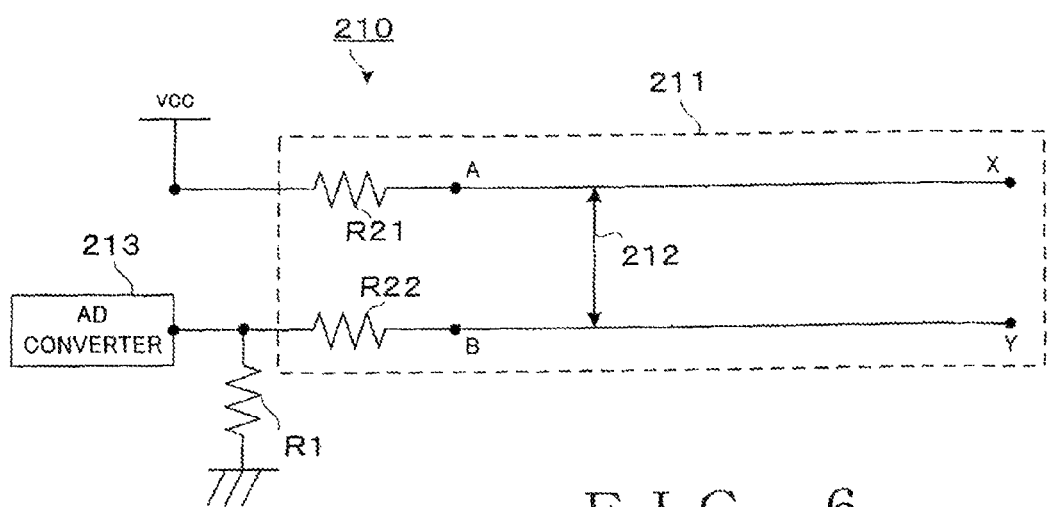
FIG. 6 is a circuit diagram showing a construction of a touch detection circuit in the first embodiment.

FIG. 6 is a circuit diagram showing a construction of touch detection circuitry 210 that, in the touch detection device 140 constructed in the aforementioned manner, performs touch detection (depressed amount detection) responsive to depressing operation on the button section 121 on the basis of variation in the resistance value of the fixed contact pattern PT1. Note that the circuit construction shown in FIG. 6 is just an illustrative example and may be modified as necessary. The touch detection circuitry 210 shown in FIG. 6 includes a sensor equivalent circuit 211 equivalent to a circuit construction of a touch detection section composed of the fixed contact pattern PT1 and the movable contact pattern PT2.

The sensor equivalent circuit 211 includes a resistance R21 corresponding to one of the contact pattern elements (i.e., first contact pattern element PT1-1) of the fixed contact pattern PT1, a resistance R22 corresponding to the other of the contact pattern elements (i.e., second contact pattern element PT1-2) of the fixed contact pattern PT1, and a movable contact 212 connecting between the resistance R21 and the resistance R22. Further, in FIG. 6, the length of the first coil-shaped contact pattern element PT1-1 is indicated by a line A-X extending from one end of the resistance R21, and the length of the second coil-shaped contact pattern element PT1-2 is indicated by a line B-Y extending from one end of the resistance R22. A relative position of the movable contact 212 to the line A-X and line B-Y corresponds to the area of the contact of the movable contact pattern PT2 with the fixed contact pattern PT1, and such a relative position moves from the end portions X and Y toward the end portions A and B in accordance with increase in the area of the contact. As the relative position of the movable contact 212 to the line A-X and line B-Y moves from the end portions X and Y toward the end portions A and B, an overall resistance R2 (=R21+R22) of the fixed contact pattern PT1 sequentially decreases in value.

The touch detection circuitry 210 is constructed to provide, with respect to a power supply voltage Vcc, an output voltage V1 corresponding to a resistance value R based on a resistance R1 inserted in a ground line and a resistance R2 (=R21+R22) of the fixed contact pattern PT1 (i.e., R=R1/(R1+R2)). As the area of the contact of the movable contact pattern PT2 with the fixed contact pattern PT1 changes in accordance with a depressed amount of the button section 121, the position of the movable contact 212 changes so that the resistance value R2 changes, and the above-mentioned output voltage V1 changes on the basis of the change of the resistance value R2.

With the touch detection circuitry 210 constructed in the aforementioned manner, the output voltage V1 (detection value) varying in accordance with the depressed amount of the button section 121 moving within the predetermined stroke range can be detected in a continuous value (analog amount) on the basis of the change of the resistance value R2 of the fixed contact pattern PT1. The touch detection circuitry 210 is constructed to input the output voltage V1 to an A/D converter 213 that converts the thus-input output voltage V1 into a digital detection value with a resolution of, for example, 128 steps from a minimum value "0" to a maximum value "127" and outputs the thus-converted digital detection value. In this way, it is possible to obtain the digital detection value corresponding to the output voltage V1 that varies in accordance with the depressed amount of the button section 121. Namely, the aforementioned arrangements can perform touch detection responsive to user's depressing operation on the push-button type operating member 120.

In the state of FIG. 5A where the depressed amount of the button section 121 is small, for example, the A/D converter 213 outputs the minimum value "0". The digital detection value output from the A/D converter 213 sequentially increases in accordance with increase in the depressed amount of the button section 121. In the state of FIG. 5B where the button section 121 has been depressed substantially to the mid position in the stroke range, the A/D converter 213 outputs a mid value "63" between the maximum value and the minimum value. Further, in the state of FIG. 5C where the button section 121 has been depressed to the lower-limit position in the stroke range, the A/D converter 213 outputs the maximum value "127".

Figure 7:
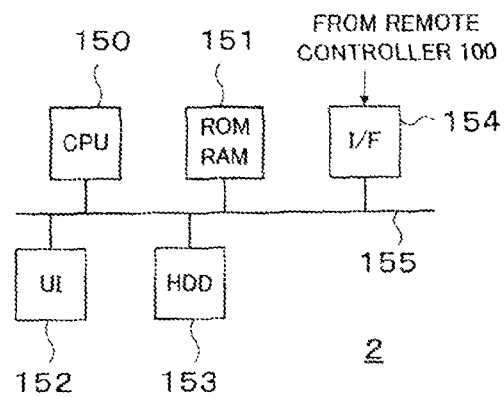
FIG. 7 is a block diagram showing an example electric hardware construction of a PC connected with the controller.

Next, a description will be given about processing and arrangement for remote-controlling the DAW software using the remote controller 100 provided with the touch detection device 140 constructed in the aforementioned manner. FIG. 7 is a block diagram showing an example electric hardware construction of the PC 2. The PC 2 includes a CPU (Central Processing Unit) 150, a memory 151 including a ROM (Read-Only Memory) and a RAM (Random Access Memory), an interface (I/F) 152, a user interface (UI) 153 and a hard disk device (HDD) 154, which are interconnected via a bus 155. The memory 151 includes a region for storing current values of a plurality of parameters related to the music production function performed by the DAW software. The PC 2 is connected to the remote controller 100 via the I/F 152. The UI 153 includes a display, a mouse and a keyboard that are provided on the PC 2 as standard equipment. The HDD 154 is an example of an external storage device, and the DAW software is prestored in the HDD 154. When the DAW software is to be executed, the CPU 150 reads out the DAW software from the HDD 154 into the memory 151 and then activates the DAW software.

Figure 8:
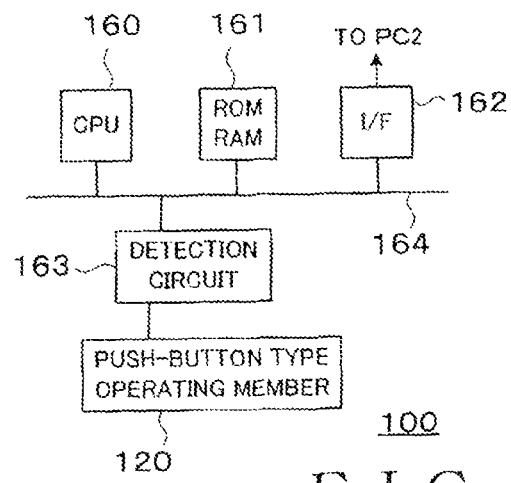
FIG. 8 is a block diagram showing an example electric hardware construction of the controller (remote controller)

FIG. 8 is a block diagram showing an example electric hardware construction of the remote controller 100. The remote controller 100 includes a CPU 160, a memory 161, an interface (I/F) 162 and a detection circuit 163, which are interconnected via a bus 164. The remote controller 100 is connected to the PC 2 via the I/F 162. The detection circuit 163 corresponds to the touch detection circuitry 210 of FIG. 6 and is connected to the plurality of push-button type operating members 120 (see FIG. 1) so that. for each of the push-button type operating members 120, it outputs a digital detection value corresponding to a depressed amount of the operating member 120.

The user can assign desired ones of the plurality of parameters, related to the music production function, to the individual push-button type operating members 120 as parameters to be operated (i.e., parameters selectable as objects of operation). Such parameter assignment can be performed via a DAW software setting screen displayed on the display (UI 152) of the PC 2. Namely, the CPU 150 and UI 152 of the PC 2 function as a parameter assignment section.

As an example form of the parameter assignment to the push-button type operating members 120, every two of the operating members 120 may be handled as one set so that a different parameter is assigned to each such set of the operating members 120. In such a case, one of the set of the operating members 120 is used for increasing the value of the assigned parameter while the other of the set of the operating members 120 is used for decreasing the value of the assigned parameter. For example, two push-button type operating members adjoining side by side, like the two push-button type operating members 120*a* and 120*b* in FIG. 1, may be handled as one set.

Once the user operates any one of the push-button type operating members 120 by depressing the push-button type operating member 120, the CPU 160 supplies the PC 2 with a digital detection value, corresponding to the depressed amount of the button section 121 of the operating member 120 detected by the detection circuit 163, as an operation signal of the button section 121. The operation signal includes information identifying the operated push-button type operating member 120 and the digital detection value detected by the detection circuit 163. Upon receipt of the operation signal from the remote controller 100, the CPU 150 of the PC 2 identifies, on the basis of the received operation signal, the parameter assigned to the operating member 120 corresponding to the received operation signal and updates the value of the identified parameter, currently stored in the memory 151, in accordance with the digital detection value contained in the operation signal. Then, on the basis of the updated result of the parameter in the memory 151, the CPU 150 for example changes displayed content of the display and controls audio signal processing.

Among the parameters to be operated (i.e., parameters selectable as objects of operation) are a group of sound-characteristic adjusting parameters, such as sound volume level, stereo pan and gain, various parameters related to MIDI performance data, such as sound pitch designation, key-on, key-off and velocity, and sound color setting parameters for MIDI sound sources. Depending on their types, these parameters differ from one another in parameter value type (e.g., integral numerical value with a positive or negative sign, integral numerical value without a positive or negative sign, numerical value with a decimal point, and letter string) and in parameter-value setting range. Therefore, the digital detection value needs to be converted in accordance with the type of the object-of-control parameter. Thus, as an example, a conversion table for converting a digital detection value into a parameter value corresponding to an identified parameter type is prestored in the memory 151 of the PC 2, separately for each of the parameter types, so that the table to be used can be switched from one to another in accordance with the type of the parameter to be operated. Namely, in this case, the CPU 150 of the PC 2 identifies the parameter type assigned to the operating member 120 corresponding to the received operation signal and updates the value of the corresponding parameter in the memory 151, by converting the digital detection value of the operation signal into a value of the parameter on the basis of the conversion table corresponding to the identified parameter type.

As another example, a conversion table for converting a digital detection value, output from the detection circuit 163, into a parameter value corresponding to an identified parameter type may be prestored in the memory 161 of the remote controller 100, separately for each of the parameter types, so that the table to be used can be switched from one to another in accordance with the type of the parameter to be operated. In this case, the CPU 160 of the remote controller 100 acquires, from the PC 2, information identifying types of parameters assigned to the push-button type operating members 120 and prestores the acquired information in the memory 161. Then, once any one of the push-button type operating members 120 is depressed or operated by the user, the CPU 160 identifies the parameter type assigned to the operated operating member 120, converts a digital detection value, output in response to the operation of the operating member 120, into a value of the parameter on the basis of the conversion table corresponding to the identified parameter type, and then supplies, as an operation signal, the converted value of the parameter to the PC 2 via the I/F 162. Thus, the PC 2 can update the value of the corresponding parameter in the memory 151, using as-is the value of the parameter contained in the operation signal.

As noted above, the instant embodiment of the remote controller 100 can obtain an output voltage V1, varying in accordance with a depressed amount of the button section 121, through a simple construction of the touch detection device 140 including the coil-shaped fixed contact pattern PT1 and the movable contact pattern PT2 formed on the lower surface 121*b* of the button section 121. Thus, it is possible to obtain a parameter value corresponding to a depressed amount of the push-button type operating member 120.

Thus, the user of the remote controller 100 can remote-control a value of any one of various parameters for controlling the behavior of the DAW software, by intuitive and simple operation of merely adjusting the depressed amount of the corresponding push-button type operating member 120. For example, when the user wants to finely adjust a sound volume level, the user only has to lightly depress the corresponding push-button type operating member 120. When the user wants to substantially adjust a sound volume level, on the other hand, the user only has to strongly depress the corresponding push-button type operating member 120. Because the instant embodiment of the remote controller 100 can acquire a parameter value corresponding to a depressed amount of the push-button type operating member 120, it is well suited to remote-control a value of a parameter of a type whose value is to be set by a numerical value within a predetermined numerical value range, such as a sound volume level. Further, parameters to be assigned to the push-button type operating members 120 as objects of operation can be freely selected and set without being restricted by their numerical-value setting ranges and parameter value types. Thus, the instant embodiment of the remote controller 100 is well suited as a remote controller of the DAW software.

Further, because the fixed contact pattern PT1 formed on the printed circuit board 130 is a coil-shaped contact pattern extending from the center toward the outer diameter side of the fixed contact pattern PT1, it can have a sufficiently great overall length (i.e., length in an uncoiled state or uncoiled length). Thus, it is possible to realize an increased dynamic range in obtaining a touch detection value based on electric resistance. Besides, because the lower surface 121b of the button section 121 having the movable contact pattern PT2 formed thereon is slanted along the diametric direction of the coil-shaped fixed contact pattern PT1, the movable contact pattern PT2 can be caused to sequentially contact the coil-shaped fixed contact pattern PT1 from the outer diameter side toward the inner diameter side in accordance with intensity of depressing operation on the button section 121. Thus, it is possible to even further increase the dynamic range of a touch detection value corresponding to variation in the area of contact between the fixed contact pattern PT1 and the movable contact pattern PT2. As a result, the touch detection device 140 can detect a depressed amount of (i.e., intensity of depressing operation on) the button section 121 precisely with a high accuracy.

Further, because the fixed contact pattern PT1 is a coil-shaped contact pattern, the instant embodiment of the touch detection device 140 can always obtain generally the same detection value, irrespective of an operated position and operated direction of the button section 121, for various depressing operation of same intensity. As a result, the instant embodiment of the touch detection device 140 is well suited to detect depressing operation on the push-button type operating member 120.

Figure 9:
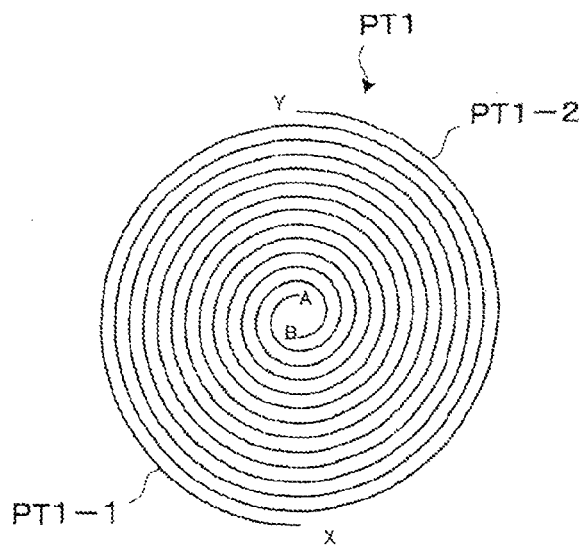
FIG. 9 is a plan view showing another construction of the fixed contact pattern.

It should be appreciated that the fixed contact pattern PT1 is not limited to the construction shown and described in FIG. 4. For example, the first contact pattern element PT1-1 and the second contact pattern element PT1-2 may be constructed as a dual coil structure such that not only their respective coil start positions A and B differ from each other but also their respective coil end positions X and Y differ from each other as shown in FIG. 9. As another alternative, the first contact pattern element PT1-1 and the second contact pattern element PT1-2 may be constructed as a dual coil structure such that only one of the coil start position (A, B) and the coil end position (X, Y) differs between the first contact pattern element PT1-1 and the second contact pattern element PT1-2. In such an alternative construction too, the size of the area over which the movable contact pattern PT2 contacts the fixed contact pattern PT1 varies in accordance with intensity of depressing operation on the button section 121, and the resistance value R2 of the fixed contact pattern PT1 decreases in accordance with increase of the area of the contact. Thus, in this case too, touch detection can be performed by the touch detection circuitry 210 of FIG. 6 on the basis of the variation in the resistance value R2 of the fixed contact pattern PT1.

Further, in the above-described embodiment of the touch detection device 140, the lower surface 121b of the button section 121 is slanted in such a manner that its height position gradually gets higher in the direction from its outer peripheral edge toward its center. Alternatively, however, the lower surface 121b of the button section 121 may be slanted in such a manner that its height position gradually gets higher along the diametric direction from its center toward its outer peripheral edge; namely, the lower surface 121b of the button section 121 may be formed in a downwardly convex shape. In such a case, the movable contact pattern PT2 sequentially contacts the fixed contact pattern PT1 in a direction from the center toward the outer diameter side of the fixed contact pattern PT1 as the button section 121 descends. With such a construction, however, the contact of the movable contact pattern PT2 with the fixed contact pattern PT1 would become a point contact if the depressed amount of the button section 121 is small, i.e. if the user makes a weak touch on the button section 121, and thus, there would occur the problem that the state of the contact becomes unstable and undesired variations easily occur in the output of the detection signal. However, if the lower surface 121b of the button section 121 is slanted in such a manner that its height position gradually gets higher in the direction from its outer peripheral edge toward its center as in the above-described embodiment, i.e. if the lower surface 121b of the button section 121 is formed in an upwardly concave shape, then the contact of the movable contact pattern PT2 with the fixed contact pattern PT1 can be made a surface contact over a generally entire outer peripheral region of the movable contact pattern PT2, even when the user makes a weak touch on the button section 121. In this way, the contact of the movable contact pattern PT2 with the fixed contact pattern PT1 can be made stable, which can effectively prevent undesired variations from occurring in the output of the detection signal. Therefore, the lower surface 121b of the button section 121 formed in an upwardly concave shape as in the above-described embodiment is more advantageous than the lower surface 121b of the button section 121 formed in a downwardly convex shape.

Also note that a modification may be made such that the outer end portions X and Y, rather than the inner end portions A and B, of the first and second coil-shaped contact pattern elements PT1-1 and PT1-2 are made the terminal positions (output ends) of the variable resistance element constituted by the combination of the fixed contact pattern PT1 and the movable contact pattern PT2. For example, in the case where the lower surface 121b of the button section 121 is formed in a downwardly convex shape, the outer end portions X and Y of the first and second coil-shaped contact pattern elements PT1-1 and PT1-2 may be made the output ends of the variable resistance element.

As another modification, the inner end portion A or B of one of the first and second coil-shaped contact pattern elements PT1-1 and PT1-2 and the outer end portion Y or X of the other of the first and second coil-shaped contact pattern elements PT1-1 and PT1-2 may be made the output ends of the variable resistance element, and the other end portions B or A and X or Y may be made the open ends. Such an arrangement is advantageous, for example, in a case where the fixed contact pattern PT1 is formed of a good electrically conductive substance while the movable contact pattern PT2 is formed of an electrically resistant substance.

Whereas, in the above-described embodiment, the fixed contact pattern PT1 is formed of an electrically resistant substance while the movable contact pattern PT2 is formed of a good electrically conductive substance, the movable contact pattern PT2 need not necessarily be formed of a good electrically conductive substance and may have electrical resistance. Conversely, the fixed contact pattern PT1 may be formed of a good electrically conductive substance, while the movable contact pattern PT2 may be formed of an electrically resistant substance. Further, the fixed contact pattern PT1 and the movable contact pattern PT2 may be formed of a capacitative element rather than an electrically resistant substance.

Furthermore, relationship between the fixed contact pattern PT1 and the movable contact pattern PT2 may be reversed from that in the above-described embodiment. For example, the first and second contact pattern elements PT1-1 and PT1-2 constituting the dual coil structure may be provided on the lower surface of the operating member 120, and a flexible uniform pattern PT2 of a concave or convex surface shape may be provided fixedly under the first and second contact pattern elements PT1-1 and PT1-2.

As still another alternative, the uniform surface pattern PT2 provided fixedly under the first and second contact pattern elements PT1-1 and PT1-2 may be formed into a hard flat surface, and the first and second contact pattern elements PT1-1 and PT1-2 provided on the lower surface of the operating member 120 to constitute the dual coil structure may have flexibility and a concave or convex surface shape.

As still another alternative, both of the fixed contact pattern PT1 and the movable contact pattern PT2 may have a surface slanted in a concave or convex shape.

As still another alternative, the coil-shaped contact pattern may be constructed as a single coil structure rather than the afore-mentioned dual coil structure, in which case a portion between one output end of the fixed contact pattern PT1 and one output end of the movable contact pattern PT2 becomes a variable resistance.

Figure 10:
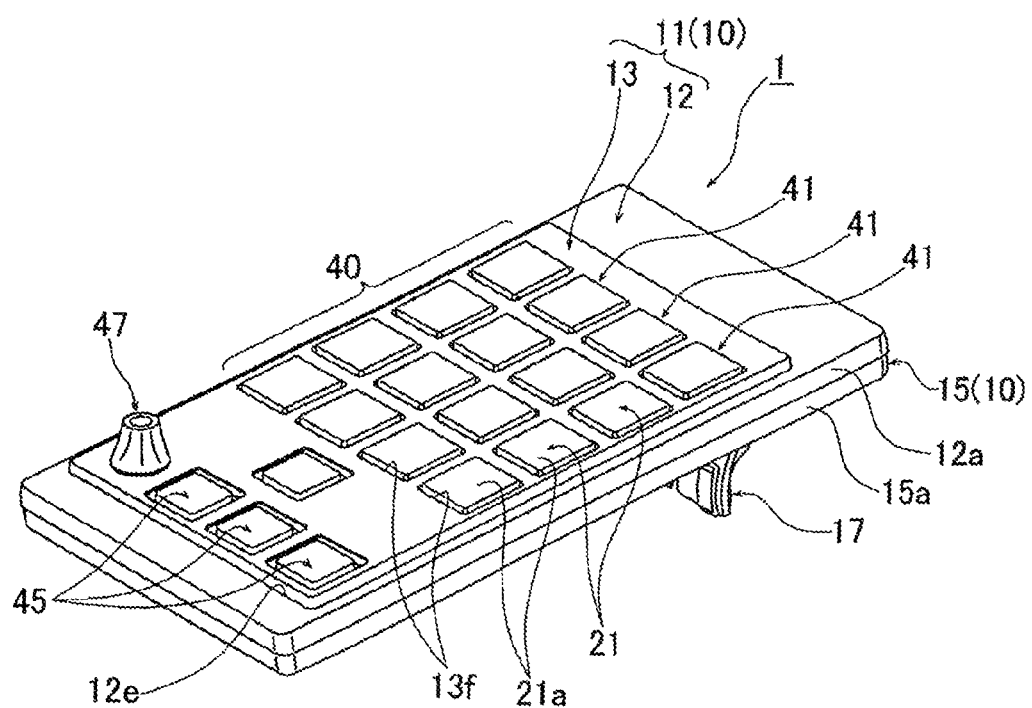
FIG. 10 is a perspective view showing an external construction of an embodiment of a controller provided with a second embodiment of the touch detection device.

Next, a description will be given about a second embodiment of the present invention. FIG. 10 is a perspective view showing an external construction of a controller 1 provided with a second embodiment of the touch detection device 40. As an example, the controller 1 functions as a music piece data input device and thus will hereinafter be referred also as "music piece data input device 1". FIG. 11 is an exploded perspective view showing various components of the controller 1. Note that FIG. 11 shows only parts of the components of the controller 1 and does not show structures for fixing together the components of the controller 1 for simplicity of illustration. The controller 1 shown in FIGS. 10 and 11 includes: an external casing 10 including an upper case 11 and a lower case 15; the touch detection device 40 including an operation section 20 and a printed circuit board (hereinafter referred to simply as "board") 30; and a metal reinforcing plate 50. Details of these components will be discussed hereinbelow.

The upper case 11 and the lower case 15 constituting the external casing 10 are each a flat plate-shaped member of a generally rectangular shape formed of synthetic resin or the like and having peripheral walls (outer peripheral edge portions). The outer peripheral edge portions 15a of the lower case 15 are bent upwardly, while the outer peripheral edge portions 12a of the upper case 11 (frame 12) are bent downwardly. The upper case 11 and the lower case 15 are vertically superposed on each other, and their respective outer peripheral edge portions 12a and 15a are fixedly joined with each other so that the upper case 11 and the lower case 15 are integrated together to provide the external casing 10. Within such an external casing 10 are accommodated the operation section 20, board 30 and reinforcing plate 50 that are components of the controller (music piece data input device) 1. The operation section 20 includes a plurality of pad sections (operating members) 21 each operable by the user depressing the same.

Further, as shown in FIG. 10, a stand 17 is mounted to the underside of the lower case 15 in such a manner that it is pivotable about pivot points (not shown) relative to the underside of the lower case 15. As shown in FIG. 10, the controller 1 can be installed in an inclined posture or position by the stand 17 being pivoted downward away from the underside of the lower case 15 to support the lower case 15 obliquely.

As shown in FIG. 11, a plurality of small projections 15b, each having a substantially cylindrical shape, are formed on the inner surface of the lower case 15 at positions corresponding to later-described fixed contact patterns PT1 provided on the board 30. The small projections 15b support, from below, the fixed contact patterns PT1 on the circuit substrate 20 that is depressed or hit by fingers of a human operator or user via the pad sections 21 of the operation section 20, and thus, the projections 15b have a function for preventing the board 30 from being deformed by the user hitting the pad sections 20 and a function for preventing reduction in detection accuracy of touch outputs.

The upper case 11 comprises two component parts: a frame (first upper case) 12 having an upper edge portion 12a superposed on an outer edge portion 15a of the lower case 15; and a panel plate (second upper case) 13 of a generally flat plate shape disposed in an opening portion 12e formed in the frame 12. The panel plate 13 has a rectangular outer shape slightly smaller than an outer shape of the frame 12 and can be snap-fit into the opening portion 12e of the frame 12. Further, the panel plate 13 has formed therein a plurality of through-holes (openings) 13f to permit exposure of respective pad surfaces 21a of the operating members 21.

The operation section 20, which is a flexible plate-shaped member (resilient member) formed of synthetic resin such as synthetic resin rubber or silicon resin, includes: a base portion 23 shaped and disposed to surround the outer peripheries of the individual fixed contact patterns PT1; a plurality of the upwardly-projecting pad sections (movable sections or operating members) 21 corresponding to the individual fixed contact patterns PT1; and flexible connection portions 25 (see FIG. 12A) connecting the pad sections (operating members) 21 to the base portion 23 in such a manner that the pad sections (operating members) 21 are movable relative to the base portion 23. Each of the pad sections (operating members) 21 is in the form of a small upward projection of a size and shape corresponding to each of the fixed contact patterns PT1, and the upper surface of each of the upwardly-projecting pad sections 21 is provided as a pad surface (i.e., operating surface) 21a operable by a user's finger or the like. A detailed construction of the operation section 20 will be discussed later in relation to the touch detection device 40.

The board 30 is a hard substrate of a substantially rectangular flat plate shape accommodatable in the lower case 15. On the board 30 are formed the fixed contact patterns PT1 in corresponding relation to individual touch detection sections 41 of the touch detection device 40. The fixed contact patterns PT1 are arranged at predetermined intervals in a matrix configuration in correspondence with the arrangement of the pad sections (operating members) 21. An LED device (light emitting component part) 35 is mounted at a center portion of each of the fixed contact patterns PT1 on the board 30. Each of the LED device 35 comprises a pair of green-color and red-color LED elements 35a and 35b arranged side by side close to each other. Thus, in accordance with intensity of touch operation detected by any one of the later-described touch detection sections 41, switching can be made among three illumination states, i.e. a state where only the green-color LED element 35a is illuminated, a state where both of the green-color and red-color LED elements 35a and 35b are illuminated and a state where only the red-color LED element 35b is illuminated. Note that yellow-color illumination is made as a whole when both of the green-color and red-color LED elements 35a and 35b are illuminated. In such a case, orange-color illumination is made as a whole if emitted light of the green-color LED element 35a has a yellowish tinge. Further, a grid-shaped spacing pattern PT3 is formed on the board 30 in such a manner as to surround the outer peripheries of the individual fixed contact patterns PT1. A detailed construction of the board 30 too will be discussed later in relation to the touch detection device 40.

The above-mentioned reinforcing plate 50 is provided underneath the board 30 within the lower case 15. The reinforcing plate 50 is a metal flat plate-shaped member having a substantially rectangular outer shape accommodatable within the lower case 15. Opposite longitudinal side edge portions 50a of the reinforcing plate 50 are upwardly-bent reinforcing portions. Through-holes 53 for permitting insertion therethrough of the projections 15b of the lower case 15 and permitting the projections 15b to abut against the undersides of the individual fixed contact patterns PT1 on the board 30 are formed in the reinforcing plate 50 at positions corresponding to the fixed contact patterns PT1 and projections 15b. The through-holes 53 each have a generally T shape.

The touch detection device 40 includes the fixed contact patterns PT1 formed on the upper surface 30a of the board 30, and movable contact patterns PT2 formed on the operation section 20. Although the instant embodiment of the controller 1 includes other operators, such as operation switches 45 and a rotary encoder 47, in addition to the touch detection sections 41 of the touch detection device 40, these other operators will not be described because they are not directly relevant to the present invention.

Figure 12A:
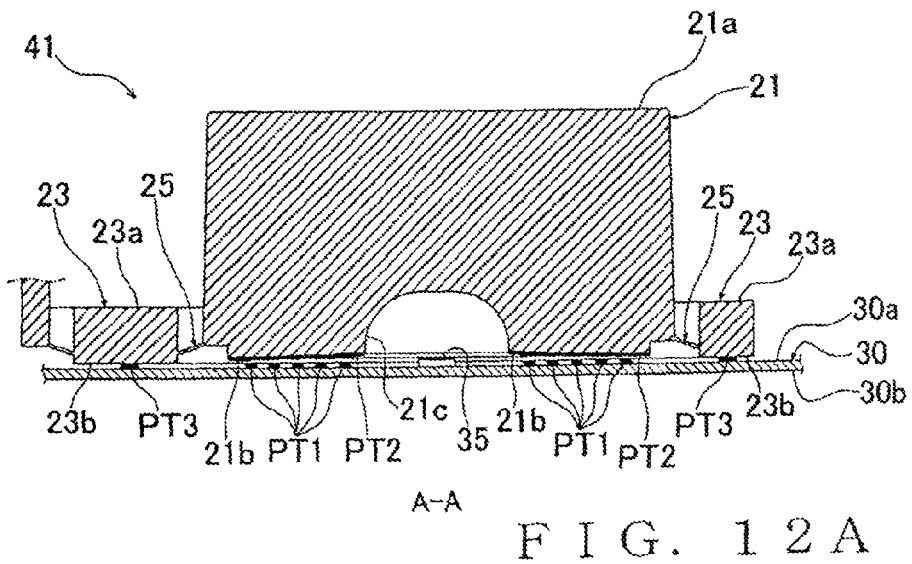
FIG. 12A is a sectional view of a touch detection section of the touch detection device shown in FIG. 11.
Figure 12B:
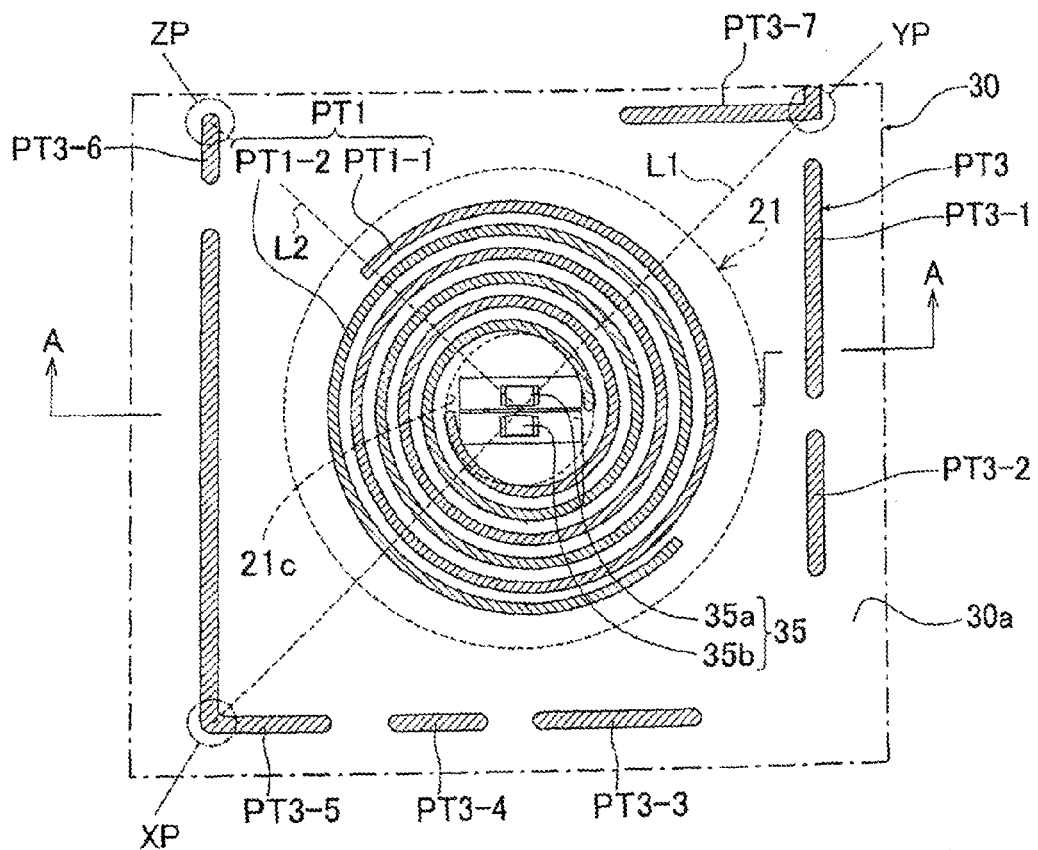
FIG. 12B is a top plan view showing the upper surface of a printed circuit board in the touch detection section.

FIGS. 12A and 12B are diagrams showing a detailed construction of one of the touch detection sections 41 of the touch detection device 40, of which FIG. 12A is a sectional view of the touch detection section 41 taken along the A-A line of FIG. 12B, and FIG. 12B is a top plan view showing the upper surface 30a of the board 30 in the touch detection section 41. Further, FIG. 13 is a bottom perspective view of one of the pad sections (operating members) 21 of the operation section 20 taken from the lower surface 21b thereof.

As shown in FIG. 12A, the operation section 20 includes the base portion 23 provided fixedly on the board 30, the pad sections 21 disposed over and in opposed relation to the individual fixed contact patterns PT1, and the connection portions (skirt portions) 25 connecting the pad sections 21 to the base portion 23 in such a manner that the pad sections 21 are movable relative to the base portion 23. As shown in FIG. 11, the base portion 23 is formed in a grid configuration extending along the vertical and horizontal sides of the operation section 20 and board 30 having a generally rectangular shape, and the base portion 23 has its lower surface 23b fixedly placed on the board 30 via the grid-shaped spacing pattern PT3. Note that the base portion 23 of the operation section 20 placed on the board 30 is fixed sandwiched between the board 30 and the upper case 11 (panel plate 13). Each of the pad sections 21 is in the form of an upward projection partly accommodatable in one of generally square openings of the grid-shaped base portion 23 (i.e., grid openings), and the pad surface (i.e., operating surface) 21a at the top of the pad section 21 is located above the upper surface 23a of the base portion 23.

Further, as shown in FIG. 13, the lower surface 21b of each of the pad sections 21 has a flat surface shape corresponding to a generally circular outline of the fixed contact pattern PT1 provided on the board 30. On such a lower surface 21b is formed the movable contact pattern PT2 for contact with the fixed contact pattern PT1 provided on the board 30. The movable contact pattern PT2 is a contact pattern having electrical conductive property, which is formed, for example, by applying conductive paint to the lower surface 21b of the pad section 21. The pad section 21 has a recessed portion 21c formed centrally in the lower surface 21b thereof such that the LED device 35 mounted on the board 30 is located in the recessed portion 21c. The recessed portion 21c is in the form of a generally dome-shaped cavity having a greater height than the LED device 35. Further, as shown in FIG. 12A, the lower surface 21b of the pad section 21 and the surface of the movable contact pattern PT2 are slightly slanted in a generally cone shape relative to the upper surface 30a of the board 30 in such a manner that their height position gradually gets higher in a direction from the outer peripheral edge of the pad section 21 toward the central recessed portion 21c. Further, the spaced-apart distance between the fixed contact pattern PT1 and the movable contact pattern PT2 is not uniform along the diametric direction of the lower surface 21b of the pad section 21, but gradually increases in a direction from the outer diameter side to the inner diameter side of the lower surface 21b. Furthermore, the operation section 20 is formed of a translucent material such that emitted light of the LED device 35 is directed through the pad section 21 toward the pad surface 21a. Note that display painting may be applied to a portion of the pad surface 21a as long as translucency is secure between the recessed portion 21c and the pad surface 21a.

Each of the connection portions 25 is a thin plate-shaped portion interconnecting the outer periphery of the corresponding pad section 21 and a side surface, defining one of the grid openings, of the base portion 23. The thin plate-shaped connection portion 25 is resiliently expandable and contractable, and vertical movement of the pad section 21 relative to the base portion 23 is permitted through the resilient expansion/contraction of the connection portion 25

Each of the fixed contact patterns PT1 provided on the upper surface 30a of the board 30 is in the form of a resistant carbon pattern, resistant conductive pattern or the like. The fixed contact pattern PT1 has, in its central portion M having the LED device 35 disposed therein, a blank space where no contact pattern is provided. Further, the fixed contact pattern PT1 comprises a pair of a first contact pattern element PT1-1 and a second contact pattern element PT1-2 extending in opposite coil shapes from respective ones of the opposite ends of the central portion M. Namely, the first contact pattern element PT1-1 and the second contact pattern element PT1-2 are coils wound in the opposite directions and arranged, starting at the central portion M, alternately at predetermined intervals along a diametric direction of the fixed contact pattern PT1.

Such a fixed contact pattern PT1 can be formed by applying conductive-paste paint onto the upper surface 30a of the board 30, or immersing, after having masked the other portion of the upper surface 30a of the printed circuit board 30 than portions where the fixed contact patterns PT1 are to be formed, the printed circuit board 30 in liquid conductive paint to thereby attach conductive paint to the upper surface 30a of the printed circuit board 30.

Further, the spacing pattern PT3 is formed on the upper surface 30a of the board 30 at the same as the fixed contact patterns PT1 and in a grid shape comprising a plurality of straight lines surrounding the outer peripheries of the individual fixed contact patterns PT1. The spacing pattern PT3 is shaped and positioned so as to correspond to the shape and position of the grid-shaped base portion 23 of the operation section 20. More specifically, around the outer periphery of each of the fixed contact patterns PT1, the spacing pattern PT3 does not provide frame lines of a complete rectangular shape surrounding the fixed contact pattern PT1, but provides intermittent frame lines with portions thereof irregularly omitted. In the illustrated example of FIG. 12B, the spacing pattern PT3, on its four (upper and lower and left and right) sides of an imaginary rectangle surrounding the outer periphery of the fixed contact pattern PT1, right-side pattern portions PT3-1 and PT3-2 provided at positions corresponding to the right side of the rectangle with a portion therebetween omitted, lower-side pattern portions PT3-3 and PT3-4 provided at positions corresponding to the lower side of the rectangle with a portion therebetween omitted, a lower-side and left-side pattern portion PT3-5 provided to extend in an L shape from the lower side to the left side by way of a left lower corner portion, and a left-side portion PT3-6, and an upper-side pattern portion PT3-7 provided at a position corresponding to a part of the upper side, with the other portions omitted.

A lead pattern (lead wiring pattern) for connecting each of the fixed contact patterns PT1 to other circuitry is provided around the fixed contact pattern PT1 on the upper surface 30a of the board 30. Therefore, the spacing pattern PT3 needs to be formed avoiding the lead pattern. This is why the spacing pattern PT3 is formed intermittently with some portions omitted irregularly with respect to the frame lines of the imaginary rectangle.

As further shown in FIG. 12B, the pattern portions PT3-5 and PT3-7 are formed to include two points XP and YP on a diagonal line L1 passing through the center of the fixed contact pattern PT1. Further, a part of the pattern portion PT3-5 extends from one of the two points X toward a point Z of another diagonal line L2 along the vertical frame line.

Namely, around the outer periphery of each of the fixed contact patterns PT1, as further shown in FIG. 12B, the spacing pattern PT3 is formed along an imaginary rectangle shape (polygonal shape) having four corner portions, and the spacing pattern PT3 has a blank portion, where the spacing pattern PT3 is formed, at a position thereof corresponding to one of the corner portions (right lower corner portion in FIG. 12B) of the rectangle.

Note that the shape, layout and construction of the spacing pattern PT3 shown in FIG. 12B is illustrative and may be other than those shown in FIG. 12B.

The following describe behavior of the touch detection device 40 constructed in the aforementioned manner. Once the operating surface (touch pad surface) 21a of any one of the pad sections 21 in the non-operating position (initial position) is depressed or hit with a user's finger or the like, the pad section 21 descends by resilient deformation of the plate-shaped connection portion 25. Thus, the movable contact pattern PT2 provided on the lower surface 21b of the pad section 21 contacts a corresponding one of the fixed contact patterns PT1 on the board 30, so that the first and second contact pattern elements PT1-1 and PT1-2 of the fixed contact patterns PT1 are electrically connected with each other. Because the lower surface 21b of the pad section 21 is slightly slanted in such a manner that its height position gradually gets higher in the direction from the outer peripheral edge toward the central recessed portion 21c, the spaced-apart distance between the fixed contact pattern PT1 and the movable contact pattern PT2 gradually increases in the direction from the outer diameter side to the inner diameter side of the fixed contact pattern PT1. Thus, as the height position of the pad section 21 varies in accordance with the intensity of the depressing or hitting operation on the pad surface 21a, the movable contact pattern PT2 sequentially touches the coil-shaped fixed contact pattern PT1 from its the outer diameter side to the inner diameter side. Namely, the area over which the movable contact pattern PT2 contacts the fixed contact pattern PT1, and hence the resistance value of the fixed contact pattern PT1, varies in accordance with the intensity of the depressing or hitting operation on the button section 21, on the basis of which the intensity of depressing or hitting operation on the button section 21 can be detected. Further, in accordance with the detected intensity of the depressing or hitting operation on the pad surface 21a, the number of the LED elements 35a and 35b to be illuminated is changed by a not-shown circuit or program-based processing, so that emitted light color of the pad surface 21a can be changed.

The LED device (light emitting component part) 35, disposed in a space of the central portion M of the fixed contact pattern PT1, comprises, for example, the green-color LED element (light emitting element) 35a and the red-color LED element (light emitting element) 35b arranged side by side close to each other. Thus, in accordance with the intensity of touch operation detected by the touch detection section 41, switching can be made among three illumination states, i.e. a state where only the green-color LED element 35a is illuminated, a state where both of the green-color and red-color LED elements 35a and 35b are illuminated and a state where only the red-color LED element 35b is illuminated. Note that orange-color illumination is made when as a whole when both of the green-color and red-color LED elements 35a and 35b are illuminated.

FIG. 14 is a fragmentary enlarged view showing the lower surfaces 21b and 23b of the operation section 20 and the pad section 21 and the upper surface 30a of the board 30. As shown in the figure, the base portion 23 of the operation section 23 has its lower surface 23b placed on the upper surface 30a of the board 30 via the spacing pattern PT3, and thus, the movable contact pattern PT2 provided on the lower surface 21b of the pad section 21 is opposed to and spaced from the fixed contact pattern PT1, provided on the upper surface 30a of the board 30, by a predetermined spaced-apart distance Da or over. Namely, at an initial position (i.e., in a non-operating position) of the pad section 21, the outermost periphery (outer peripheral edge) S of the movable contact pattern PT2 is spaced part from the fixed contact pattern PT1 by the spaced-apart distance Da. Such a spaced-apart distance of the movable contact pattern PT2 from the fixed contact pattern PT1 gradually increases in a direction from the outermost periphery (outer peripheral edge) S toward the center of the movable contact pattern PT2. However, for convenience of description, the following description will be given assuming that the spaced-apart distance between the fixed contact pattern PT1 and the movable contact pattern PT2 is the spaced-apart distance Da.

The spacing pattern PT3 is formed on the upper surface 30a of the board 30 at the same step as the fixed contact pattern PT1. For example, the material of the spacing pattern PT3 is applied to the upper surface 30a of the board 30 at the same step as the material of the fixed contact pattern PT1 is applied to the upper surface 30a of the board 30. Alternatively, the material of the spacing pattern PT3 is adhered to the upper surface 30a of the board 30 at the same step as the board 30 is immersed in liquid conductive paint for adhering the material of the fixed contact pattern PT1 to the upper surface 30a of the board 30. Thus, the spacing pattern PT3 will have a same thickness dimension Dp as the fixed contact pattern PT1.

In the aforementioned manner, the spacing pattern PT3, having the same thickness dimension Dp as the fixed contact pattern PT1, is provided around the outer periphery of the fixed contact pattern PT1, and the base portion 23 of the operation section 20 is fixedly placed on the upper surface 30a of the board 30 via the spacing pattern PT3. Thus, even where the thickness dimension Dp of the fixed contact pattern PT1 formed on the board 30 differs among different products of the controller, the spaced-apart distance Da between the fixed contact pattern PT1 and the movable contact pattern PT2 can be made generally the same among the different products.

More specifically, the fixed contact pattern PT1 is formed by applying conductive paint onto the upper surface 30a of the board 30, or immersing the board 30 in liquid conductive paint, as noted above. Therefore, generally, the thickness dimension Dp of the fixed contact pattern PT1 would not necessarily be maintained the same throughout individual steps and would differ, although slightly, among products (product lots) depending on various conditions, such as a temperature and humidity at the time of formation of the contact pattern PT1.

Therefore, without the spacing pattern PT3, the spaced-apart distance Db between the upper surface 30a of the board 30 and the movable contact pattern PT2 provided on the lower surface 21b of the pad section 21 would be determined by dimensions, shapes, etc. of various portions of the operation section 20, such as the base portion 23, connection portions 25 and pad section 21. Further, even where the spacing pattern PT3 is provided, if the spacing pattern PT3 is formed at a different step from the fixed contact pattern PT1, the spaced-apart distance Db would become a combination of the spaced-apart distance determined by the dimensions of the various portions of the operation section 20 and the thickness dimension of the spacing pattern PT3 having no relation with the thickness dimension of fixed contact pattern PT1. Therefore, if the thickness dimension Dp of the fixed contact pattern PT1 differs among products, then the spaced-apart distance Da between the fixed contact pattern PT1 and the movable contact pattern PT2 would inevitably differ among the products. As a consequence, it would become difficult to make touch detection sensitivity of the touch detection device 40 uniform among a plurality of products.

By contrast, in the instant embodiment of the touch detection device 40, the spacing patter PT3, formed at the same step as the fixed contact pattern PT1 and having the same thickness dimension Dp as the fixed contact pattern PT1, is provided around the outer periphery of the fixed contact pattern PT1, and the base portion 23 of the operation section 20 is provided on the upper surface 30a of the board 30 via the spacing patter PT3. Thus, in the instant embodiment of the touch detection device 40, the position of the lower surface 23b of the base portion 23 relative to the upper surface 30a of the board 30 is defined by the spacing patter PT3 having the same thickness dimension Dp as the fixed contact pattern PT1. Namely, the base portion 23 and the pad section 21 of the operation section 20 are installed at a position offset from the upper surface 30a of the board 30 by a distance corresponding to the thickness dimension Dp of the fixed contact pattern PT1. Thus, even where the thickness dimension Dp of the fixed contact pattern PT1 differs among products of the controller, the spaced-apart distance Da between the fixed contact pattern PT1 and the movable contact pattern PT2 can be made generally uniform among the products. As a result, it is possible to make touch detection sensitivity of the touch detection device 40 uniform among a multiplicity of products of the controller.

Furthermore, as shown in FIG. 11, the instant embodiment of the touch detection device 40 includes a plurality of the touch detection sections 41 each comprising a set of the fixed contact pattern PT1 provided on the board 30 and the pad section 21 and movable contact pattern PT2 of the operation section 20. Whereas the same numbers of the fixed contact patterns PT1, pad sections 21 and movable contact patterns PT2 as the touch detection sections 41 are provided to constitute the plurality of the touch detection sections 41, portions of the spacing pattern PT3 and the base portion of the operation section 20 are shared between adjoining ones of the touch detection sections 41. Namely, the spacing pattern PT3 is formed in an intermittent or "partly-omitted" fashion with respect to the fixed contact patterns PT1 of the touch detection sections 41.

Because the spacing pattern PT3 is formed in a partly-omitted fashion as noted above, the overall installation area of the spacing pattern PT3 can be reduced even where a multiplicity of the touch detection sections 41 are provided. As a result, it is possible to reduce the size of the music piece data input device 1 provided with a multiplicity of the touch detection sections 41.

Further, in the instant embodiment, the spacing pattern PT3 is formed in an intermittent or partly-omitted fashion unlike a complete grid-shaped spacing pattern surrounding the individual fixed contact patterns PT1. Thus, even where the wiring pattern for directing detection outputs from the fixed contact patterns PT1 to outside of the spacing pattern PT3 is formed on the board 30, the wiring pattern can be disposed to pass through the omitted portions (blank portions) of the spacing pattern PT3 so that the spacing pattern PT3 can be prevented from interfering with the wiring pattern.

Furthermore, in the instant embodiment, the spacing pattern PT3 is formed so as to include at least two points X and Y on the diagonal line L1 passing through the center of the fixed contact pattern PT1 and extend from one of the two points X toward the point Z of the other diagonal line L2 along the vertical frame line. Thus, even where the spacing pattern PT3 is formed intermittently as noted above, the spacing pattern PT3 allows the base portion 23 of the operation section 20 to be fixedly placed on the upper surface 30a of the board 30 in a stable manner.

Furthermore, in the embodiment where the spacing pattern PT3 is provided on the board 30, the fixed contact patterns PT1 may each be formed on the upper surface 30a in any other suitable shape than the coiled shape. For example, the fixed contact patterns PT1 may be formed in a barcode configuration comprising a plurality of straight contact patterns arranged parallel to one another at predetermined intervals, in which case the movable contact pattern PT2 opposed to such fixed contact patterns PT1 may each be of a slanted surface shape slanted along the arranged direction of the plurality of straight contact patterns of the corresponding fixed contact pattern PT1.

Furthermore, the spacing pattern PT3 may be of any other suitable shape than the aforementioned intermittent grid shape, as long as the shape of the spacing pattern PT3 corresponds to the shape of the base portion 23 of the operation section 20. For example, if the base portion 23 is formed in another polygonal shape than the square or rectangular grid shape, the spacing pattern PT3 too can be formed intermittently along frame lines of imaginary polygonal shapes corresponding to the polygonal shape of the base portion 23. In that case, the spacing pattern PT3 may be formed to include, for each of the fixed contact patterns PT1, at least two points on a diagonal line passing through the center of the fixed contact pattern PT1. Further, if the base portion 23 is formed in another shape, such as a curved shape, than the aforementioned grid shape comprising straight lines, the spacing pattern PT3 may be formed in a curved shape corresponding to the curved shape of the base portion 23.

The following describe an embodiment of a construction for detecting touch operation on any one of the touch detection sections 41. FIG. 15A is a circuit diagram showing an example construction of touch detection circuitry for detecting touch operation on any one of the touch detection sections 41, and FIG. 15B is a diagram showing correspondence relationship between the fixed contact pattern PT1 and various points and resistances in FIG. 15A. Note, however, that the touch detection circuitry shown in FIG. 15A is an example of circuitry capable of detecting intensity of touch operation on the touch detection section 41 and is not necessarily limited to the construction illustrated in the figure. The touch detection circuitry 200 shown in FIG. 15A includes a sensor equivalent circuit 201 equivalent to a circuit construction of the touch detection section 200 composed of the fixed contact pattern PT1 and the movable contact pattern PT2. The sensor equivalent circuit 211 includes a resistance R21 corresponding to one of the contact pattern elements (i.e., first contact pattern element PT1-1) of the fixed contact pattern PT1, and a resistance R22 corresponding to the other of the contact pattern elements (i.e., second contact pattern element PT1-2) of the fixed contact pattern PT1. A resistance value R2 (R2=R21+R22) varies in accordance with variation in the area and pressure of contact between the fixed contact pattern PT1 and the movable contact pattern PT2. In FIG. 15A, the sensor equivalent circuit 201 is shown as constructed in such a manner that needles 201a contacting the resistances R21 and R22 move in accordance with intensity of depressing operation on the pad section 21 and the resistance values R21 and R22 vary in accordance with positions where the needles 201a contact the resistances R21 and R22 (i.e., contacting positions of the needles 201a).

In the touch detection circuitry 200 shown in FIG. 15A, a voltage V1 at a point P2 varies in accordance with variation in the area (or pressure) of contact between the movable contact pattern PT2 and the fixed contact pattern PT1. Thus, with respect to an input voltage V, there is obtained an output voltage V1 corresponding to a resistance value R (R=R1/(R1+R2)) provided by resistances R1 and R2.

The touch detection circuitry 200 has been described above as constructed in such a manner that the resistance value R2 (R2=R21+R22) varies in accordance with variation of the area and pressure of contact between the fixed contact pattern PT1 and the movable contact pattern PT2. Alternatively, the touch detection circuitry 200 may be constructed in such a manner that the resistance value R2 varies in accordance with variation in only the area of contact between the fixed contact pattern PT1 and the movable contact pattern PT2. To this end, it is only necessary to set the resistances R21 and R22 at high resistance values (preferably, resistance value of each of the resistances R21 and R22=10KΩ–100KΩ, and R21=R22), set the ground-side resistance R1 at a resistance value equal to or smaller than that of the resistance R21 (i.e., R1≤R21) and set a resistance value of the movable contact pattern PT2 (in the circuit diagram, of FIG. 15A, the resistance value of the movable contact pattern PT2 is regarded as "0") to be extremely low as compared to a resistance value of the fixed contact pattern PT1 (e.g., the movable contact pattern PT2 may be set at about 0.1Ω–100Ω that is a resistance value when the pad section 21 has been depressed with intensity such that the pad section 21 descends through its full downward stroke).

FIG. 15C is a graph schematically showing variation in the output voltage V1 responsive to variation in the stroke amount (descending amount) of the pad section 21. In the touch detection section 21, the area of contact of the movable contact pattern PT2 with the coil-shaped fixed contact pattern PT1 sequentially increases as the stroke amount of the pad section increases from a point C where the contact between the fixed contact pattern PT1 and the movable contact pattern PT2 starts. Thus, the resistance value R2 (R21+R22) between the fixed contact pattern PT1 and the movable contact pattern PT2 gradually decreases, so that the output voltage V1, represented by V1={R1/(R1+R2)}×V, gradually increases. Then, at and after a point D where the movable contact pattern PT2 contacts the entire the fixed contact pattern PT1, the output voltage V1 takes a maximum value V.

In the touch detection circuitry 200, the above-mentioned output voltage V1 is input to a peak and hold (P/H) circuit 203, so that a peak hold voltage $V_L$ is obtained. This peak hold voltage $V_L$ is taken into a later-described RAM 103 or the like, so that a later-described CPU 101 uses the peak hold voltage $V_L$ to identify intensity of touch operation on the touch detection section 41. In response to the peak hold voltage $V_L$ being taken into the RAM 103 or the like, an intake completion signal SG is input from the CPU 101 to the peak hold circuit 203, in response to which the peak hold circuit 203 is reset.

Figure 16:
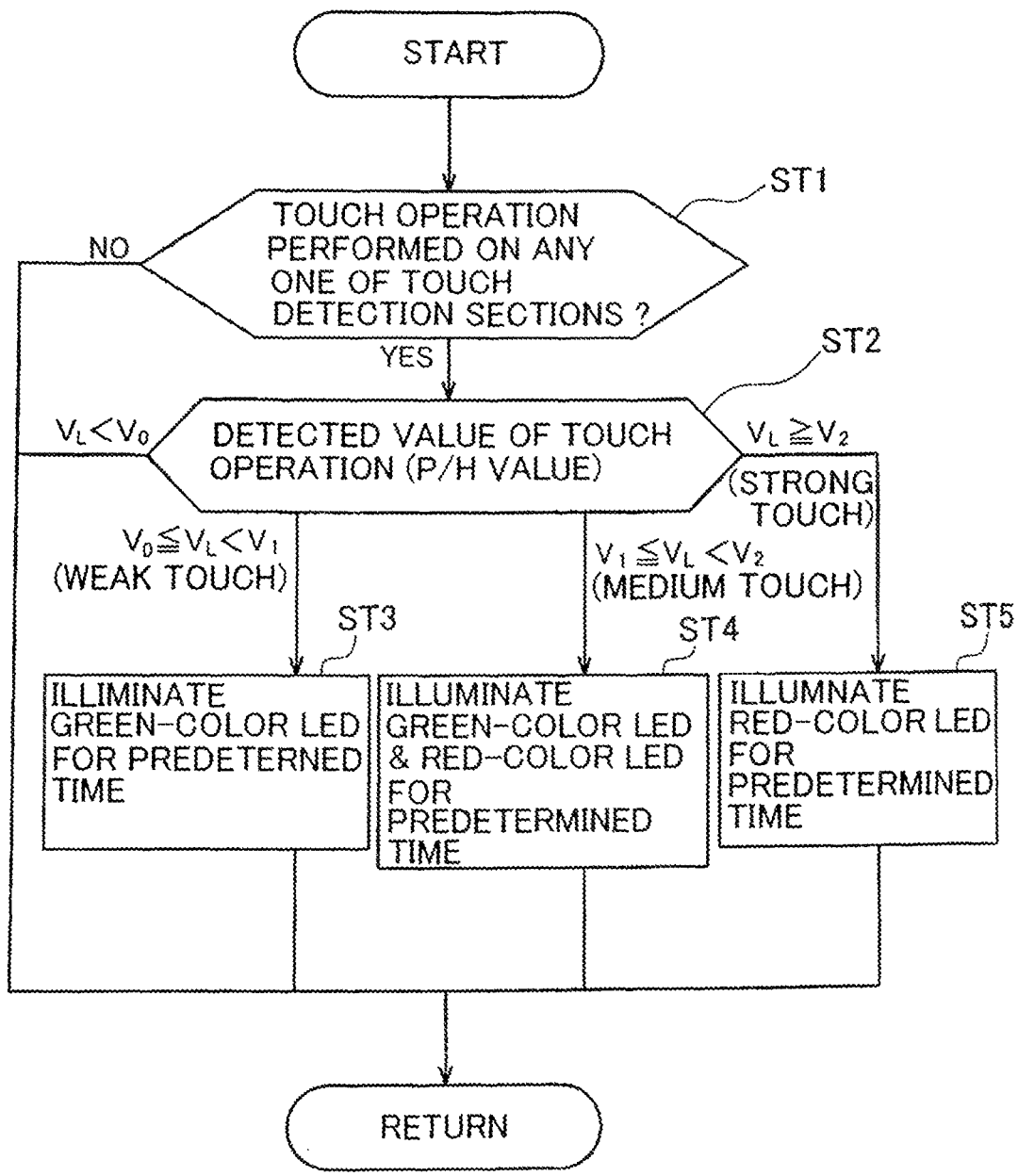
FIG. 16 is a flow chart explanatory of an operational sequence for illuminating an LED device on the basis of detection of touch operation.

Further, each of the touch detection sections 41 of the touch detection device 40 is constructed to switch among the illumination states of the LED device (light emitting component part) 35 in accordance with the intensity of the touch operation detected by the touch detection circuitry 200. The following describe an operational sequence for switching among the illumination states of the LED device 35. FIG. 16 is a flow chart explanatory of the operational sequence for switching among the illumination states of the LED device 35. First, at step ST1, a determination is made as to whether touch operation has been performed on any one of the touch detection sections 41 of the touch detection device 40. If touch operation has not been performed on any one of the touch detection sections 41 (NO determination at step ST1), the processing waits until touch operation is performed thereon. Once touch operation has been performed (YES determination at step ST1), comparisons are made, at step ST2, between a value of a detected voltage (peak hold voltage) $V_L$ of the touch operation detected by the aforementioned touch detection circuitry 200 and three preset voltage threshold values $V_0$, $V_1$ and $V_2$ (here, $V_0 < V_1 < V_2$).

If the detected voltage $V_L$ is smaller than the threshold value $V_0$ ($V_L < V_0$) as a result of the comparison, the LED device 35 is not illuminated. If the detected voltage $V_L$ is equal to or greater than the threshold value $V_0$ but smaller than the threshold value $V_1$ ($V_0 \le V_L < V_1$), the touch operation is determined to be "weak touch operation", so that only the green-light LED element 35a is illuminated for a predetermined time period at step ST3. Thus, the operating surface 21a of the pad section 21 is illuminated in green color. If the detected voltage $V_L$ is equal to or greater than the threshold value $V_1$ but smaller than the threshold value $V_2$ ($V_1 \le V_L < V_2$), the touch operation is determined to be "medium touch operation", so that both the green-light LED element 35a and the red-light LED element 35b are illuminated for a predetermined time period at step ST4. Thus, the operating surface 21a of the pad section 21 is illuminated in orange color. Further, if the detected voltage $V_L$ is equal to or greater than the threshold value V2 ($V_2 \le V_L$), the touch operation is determined to be "strong touch operation", so that only the red-light LED element 35b is illuminated for a predetermined time period at step ST5. Thus, the operating surface 21a of the pad section 21 is illuminated in red color. In the aforementioned manner, the illuminated color of the operating surface 21a can be switched among three stages, i.e. green color, orange color and red color, in accordance with the intensity of the touch operation on the operating surface 21a of the touch detection section 41.

As described above, in the instant embodiment of the touch detection device 40, the fixed contact patterns PT1 on the board 30 are each formed to extend in a coil shape from the central portion M toward the outer diameter side. Thus, each of the fixed contact patterns PT1 can have a sufficiently great overall length (i.e., uncoiled length). In addition, because the lower surface of each of the pad sections 21 having the movable contact pattern PT2 formed thereon is slanted along the diametric direction of the coil-shaped fixed contact pattern PT1, the movable contact pattern PT2 can sequentially contact the fixed contact pattern PT1 from its outer diameter side to its inner diameter side in accordance with intensity of depressing operation on the pad section 21. Thus, it is possible to increase the dynamic range of the detection value of touch operation through contact between the fixed contact pattern PT1 and the movable contact pattern PT2. In this way, the touch detection device 40 can detect intensity of touch operation precisely with a high accuracy.

Further, with the instant embodiment of the touch detection device 40, generally the same output value can always be obtained, irrespective of an operated position and operated direction, for various touch operation of the same intensity. Thus, the touch detection device 40 can be well suited for detecting touch operation on a push-button type pad operator. Furthermore, the LED device 35, which is a light emitting component part, is disposed in the central portion M of the coil-shaped fixed contact pattern PT1 and the pad section 21 has translucency to direct emitted light from the LED device 35 toward the pad surface 21a, so that the LED device 35 for displaying a state responsive to touch operation (touch operation response state) is provided immediately under the pad section 21. In this way, the LED device 35 can be effectively disposed in a reduced space. Further, the user performing touch operation can more intuitively grasp information, such as intensity of the touch operation. Furthermore, with the instant embodiment of the touch detection device 40, the illumination of the LED device 35 is variable by switching among the illumination states of the green-color and red-color LED elements 35a and 35b, and thus, a touch operation response state can be displayed more appropriately.

Furthermore, in the instant embodiment of the touch detection device 40, the recessed portion 21c formed in the lower surface 21b of the pad section 21 can prevent the operated pad section 21 from interfering with the LED device 35 when the operated pad section 21 descends, so that smooth movement of the pad section 21 can be secured. Further, because the emitted light from the LED device 35 can be scattered by the recessed portion 21c, there can also be achieved an advantageous benefit of enhancing the luminance of the pad surface 21a. Furthermore, the provision of the recessed portion 21c in the pad section 21 can increase the flexibility of the pad section 21, and thus, it is possible to secure a good contact state of the movable contact pattern PT2, formed on the lower surface 21b of the pad section 21, with the fixed contact pattern PT1.

Next, a description will be given about a construction of control circuitry provided in the controller 1 functioning as a music piece data input device. FIG. 17 is a block diagram showing the construction of the control circuitry provided in the controller (music piece data input device) 1. As shown in FIG. 17, the controller (music piece data input device) 1 is controlled by a microcomputer that includes the microprocessor unit (CPU) 101, a read-only memory (ROM) 102 and a random access memory (RAM) 103. The CPU 101 controls general behavior of the controller 1, and to the CPU 101 are connected, via a bus 109, the ROM 102, the RAM 103, detection circuitry 104, a display circuit 106 for controlling a display 107, a communication interface (I/F) 108, etc.

The ROM 102 stores therein various control programs to be executed by the CPU 101 and various data to be referenced by the CPU 101. The RAM 103 is used as a working memory for temporarily storing various data etc. generated as the CPU 101 executes a predetermined program, and as a memory for temporarily storing a currently-executed program and related data. Predetermined address regions of the RAM 103b are assigned to various functions and used as registers, flags, tables, memories, etc.

Operators 105 are operable to set whether or not to impart various functions or set various setting parameters. In the instant embodiment of the controller 1, the individual touch detection sections 41 provided in the touch detection device 40 correspond to the operators 105. The touch detection sections 41 are each a pad type switch operable to generate music piece data in response to detection of hitting operation thereon. The touch detection circuitry 200 shown in FIG. 15A is included in the detection circuitry 104.

The communication interface (I/F) 108 is an interface connected to a general-purpose or dedicated communication cable, or a wired or wireless communication network, such as a LAN, the Internet or a telephone line, so that it is connected to another computer (not shown) via the communication cable or communication network to communicate music piece data, various signals and information with the other computer. Note that such a communication interface (I/F) 108 may be of both of the wired and wireless types rather than either of the wired and wireless types. In response to user's depressing operation, such as hitting operation, on any one of the touch detection sections 41 (pad type switches) of the controller (music piece data input device) 1, music piece data of a drum tone color can be input to a computer where a music piece production software program is running.

Whereas the embodiment has been described above in relation to the case where the LED device 35, which is a light emitting component part, comprises the LED elements 35a and 35b of different emitted colors, the present invention is not so limited, and the light emitting component part employed in the present invention may comprises a plurality of LED elements of a same emitted color, in which case intensity of emitted light can be varied by changing the number of the LED elements to be illuminated.

This application is based on, and claims priorities to, JP PA 2011-188035 filed on 30 Aug. 2011, JP PA 2011-188036 filed on 30 Aug. 2011, and JP PA 2011-196233 filed on 8 Sep. 2011. The disclosure of the priority applications, in its entirety, including the drawings, claims, and the specification thereof, are incorporated herein by reference.

What is claimed is:

1. A controller comprising:
an operating member operable by a user's depression thereof; and
a touch detection device constructed to detect a depressing touch on said operating member, said touch detection device including:
a movable contact pattern provided on a lower surface of said operating member; and
a fixed contact pattern disposed underneath said operating member,
wherein one of said fixed contact pattern and said movable contact pattern is a coil-shaped contact pattern, and other of said fixed contact pattern and said movable contact pattern is a uniform surface pattern,
at least one of said fixed contact pattern and said movable contact pattern has flexibility,
at least one of said fixed contact pattern and said movable contact pattern has a surface slanted from a center of a coil of the coil-shaped contact pattern toward an outer peripheral edge of the coil, said fixed contact pattern is the coil-shaped contact pattern formed on a printed circuit board, said movable contact pattern has the flexibility and the surface slanted from the center of the coil toward the outer peripheral edge of the coil, a light emitting component part is provided centrally in the coil of the coil-shaped contact pattern on the printed circuit board, and said operating member has translucency to direct light, emitted from said light emitting component part, toward an upper surface of said operating member.

2. The controller as claimed in claim 1, wherein said coil-shaped contact pattern comprises first and second contact pattern elements constituting a dual coil configuration.

3. The controller as claimed in claim 1, wherein said fixed contact pattern is the coil-shaped contact pattern formed on a board, and said movable contact pattern has the flexibility and the surface slanted from the center of the coil toward the outer peripheral edge of the coil.

4. The controller as claimed in claim 1, wherein at least one of said fixed contact pattern and said movable contact pattern is formed of an electric resistant substance.

5. The controller as claimed in claim 1, wherein the surface slanted from the center of the coil toward the outer peripheral edge of the coil has a concave shape.

6. The controller as claimed in claim 1, which comprises a plurality of the operating members and said touch detection device corresponding to individual ones of the operating members.

7. The controller as claimed in claim 1, wherein in response to depression of the operating member, the controller is configured to output a signal for remote-controlling behavior related to a music production function to be performed by a computer.

8. The controller as claimed in claim 7, which further comprises:

an assignment section constructed to assign, to one said operating member, one of a plurality of types of parameters for controlling the behavior related to the music production function to be performed by the computer;

a conversion table adapted to convert a detection value, indicative of a depressing touch detected by said touch detection device, into a value of a parameter of a given parameter type; and a parameter value output section constructed to identify, in response to depressing operation of said operating member, a parameter type assigned to said operating member by said assignment section, convert, on the basis of the conversion table, the detection value, output by said touch detection device, into a value of the parameter of the identified parameter type and thereby output the converted value of the parameter.

9. The controller as claimed in claim 1, wherein a spacing pattern is formed on the printed circuit board adjacent to said fixed contact pattern, said operating member includes a base portion and a pad section movable relative to the base portion, and the base portion of said operating member is installed on the printed circuit board via said spacing pattern.

10. The controller as claimed in claim 9, wherein said spacing pattern is formed at a same step as said fixed contact pattern.

11. The controller as claimed in claim 10, wherein said spacing pattern has a same thickness as said fixed contact pattern.

12. The controller as claimed in claim 9, which comprises a plurality of the operating members and said touch detection device corresponding to individual ones of the operating members, and wherein said spacing pattern is formed on the printed circuit board in such a manner that a portion thereof is shared between adjoining ones of the operating members.

13. The controller as claimed in claim 9, wherein said spacing pattern is formed intermittently along frame lines of an imaginary polygonal shape surrounding the fixed contact pattern, said spacing pattern being formed so as to include at least two points on a diagonal line, passing through a center of the fixed contact pattern, of the imaginary polygonal shape.

14. The controller as claimed in claim 13, wherein said spacing pattern extends from at least one of the two points on the diagonal line, along one of the frame lines toward a point of another diagonal line of the imaginary polygonal shape.

15. The controller as claimed in claim 9, wherein said spacing pattern is formed to extend around an outer periphery of the fixed contact pattern along an imaginary polygonal shape having a plurality of corner portions, and said spacing pattern has a blank portion, where no pattern is formed, at a position thereof corresponding to at least one of the corner portions.

16. The controller as claimed in claim 1, wherein said light emitting component part comprises a plurality of light emitting elements, and said operating member is formed of synthetic resin having translucency.

17. The controller as claimed in claim 1, wherein said operating member has a recessed portion formed in the lower surface at a position opposed to the light emitting component part.

* * * * *